US009105332B2

(12) United States Patent
Ikeda et al.

(10) Patent No.: US 9,105,332 B2
(45) Date of Patent: Aug. 11, 2015

(54) VARIABLE RESISTANCE NONVOLATILE MEMORY DEVICE

(71) Applicant: Panasonic Corporation, Osaka (JP)

(72) Inventors: Yuichiro Ikeda, Hyogo (JP); Kazuhiko Shimakawa, Osaka (JP); Koji Katayama, Nara (JP); Takumi Mikawa, Shiga (JP); Kiyotaka Tsuji, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 14 days.

(21) Appl. No.: 14/116,482

(22) PCT Filed: Mar. 7, 2013

(86) PCT No.: PCT/JP2013/001438

§ 371 (c)(1),
(2) Date: Nov. 8, 2013

(87) PCT Pub. No.: WO2013/136731

PCT Pub. Date: Sep. 19, 2013

(65) Prior Publication Data

US 2014/0126267 A1 May 8, 2014

(30) Foreign Application Priority Data

Mar. 15, 2012 (JP) ................................. 2012-059135

(51) Int. Cl.
*G11C 11/00* (2006.01)
*G11C 13/00* (2006.01)
(Continued)

(52) U.S. Cl.
CPC ........ *G11C 13/0069* (2013.01); *G11C 13/0007* (2013.01); *H01L 27/2409* (2013.01);
(Continued)

(58) Field of Classification Search
USPC .................................................. 365/148, 158
See application file for complete search history.

(56) References Cited

U.S. PATENT DOCUMENTS 7,869,258 B2    1/2011  Scheuerlein et al.
7,978,497 B2    7/2011  Maejima
(Continued)

FOREIGN PATENT DOCUMENTS

JP    2009-217908    9/2009
JP    4531863        8/2010
(Continued)

OTHER PUBLICATIONS

International Search Report issued Apr. 9, 2013 in International Application No. PCT/JP2013/001438.

*Primary Examiner* — Anthan Tran
(74) *Attorney, Agent, or Firm* — Wenderoth, Lind & Ponack, L.L.P.

(57) ABSTRACT

Provided is a variable resistance element (Rij) the resistance state of which is reversibly changed by applying electrical signals of different polarities; and a current steering element (Dij) in which a first current is larger than a second current, the first current being a current which flows when a voltage of the first polarity having a first value is applied, the first value being less than a predetermined voltage value and having an absolute value greater than zero, the second current being a current which flows when a voltage of the second polarity having an absolute value which is the first value is applied, the second polarity being different from the first polarity, in which Rij and Dij are connected in series such that the polarity of a voltage to be applied to Dij is the second polarity when the resistance state of Rij is changed to high resistance state.

7 Claims, 13 Drawing Sheets

(51) Int. Cl.
*H01L 27/24* (2006.01)
*H01L 45/00* (2006.01)

(52) U.S. Cl.
CPC ........ *H01L27/2463* (2013.01); *G11C 2213/72* (2013.01); *H01L 45/08* (2013.01); *H01L 45/1233* (2013.01); *H01L 45/146* (2013.01); *H01L 45/1625* (2013.01); *H01L 45/1675* (2013.01)

(56) References Cited

U.S. PATENT DOCUMENTS

| | | | |
|---|---|---|---|
| 8,085,577 | B2 | 12/2011 | Kanno et al. |
| 8,227,788 | B2 | 7/2012 | Mikawa et al. |
| 8,274,815 | B2 | 9/2012 | Ichihara et al. |
| 8,399,875 | B1 | 3/2013 | Mikawa et al. |
| 8,441,837 | B2 | 5/2013 | Ikeda et al. |
| 2009/0224224 | A1 | 9/2009 | Fujii et al. |
| 2009/0244953 | A1 | 10/2009 | Maejima |
| 2010/0295012 | A1 | 11/2010 | Mikawa et al. |
| 2011/0026299 | A1 | 2/2011 | Kanno et al. |
| 2011/0122680 | A1 | 5/2011 | Ikeda et al. |
| 2011/0216574 | A1 | 9/2011 | Ichihara et al. |
| 2012/0320662 | A1 | 12/2012 | Ichihara et al. |
| 2013/0056701 | A1 | 3/2013 | Mikawa et al. |
| 2013/0128654 | A1* | 5/2013 | Yoneda et al. ................. 365/148 |
| 2013/0208529 | A1* | 8/2013 | Tomotani et al. ............. 365/148 |

FOREIGN PATENT DOCUMENTS

| | | |
|---|---|---|
| JP | 2011-34637 | 2/2011 |
| JP | 2011-181144 | 9/2011 |
| WO | 2008/059701 | 5/2008 |
| WO | 2009/050861 | 4/2009 |
| WO | 2010/058569 | 5/2010 |
| WO | 2010/119671 | 10/2010 |

* cited by examiner

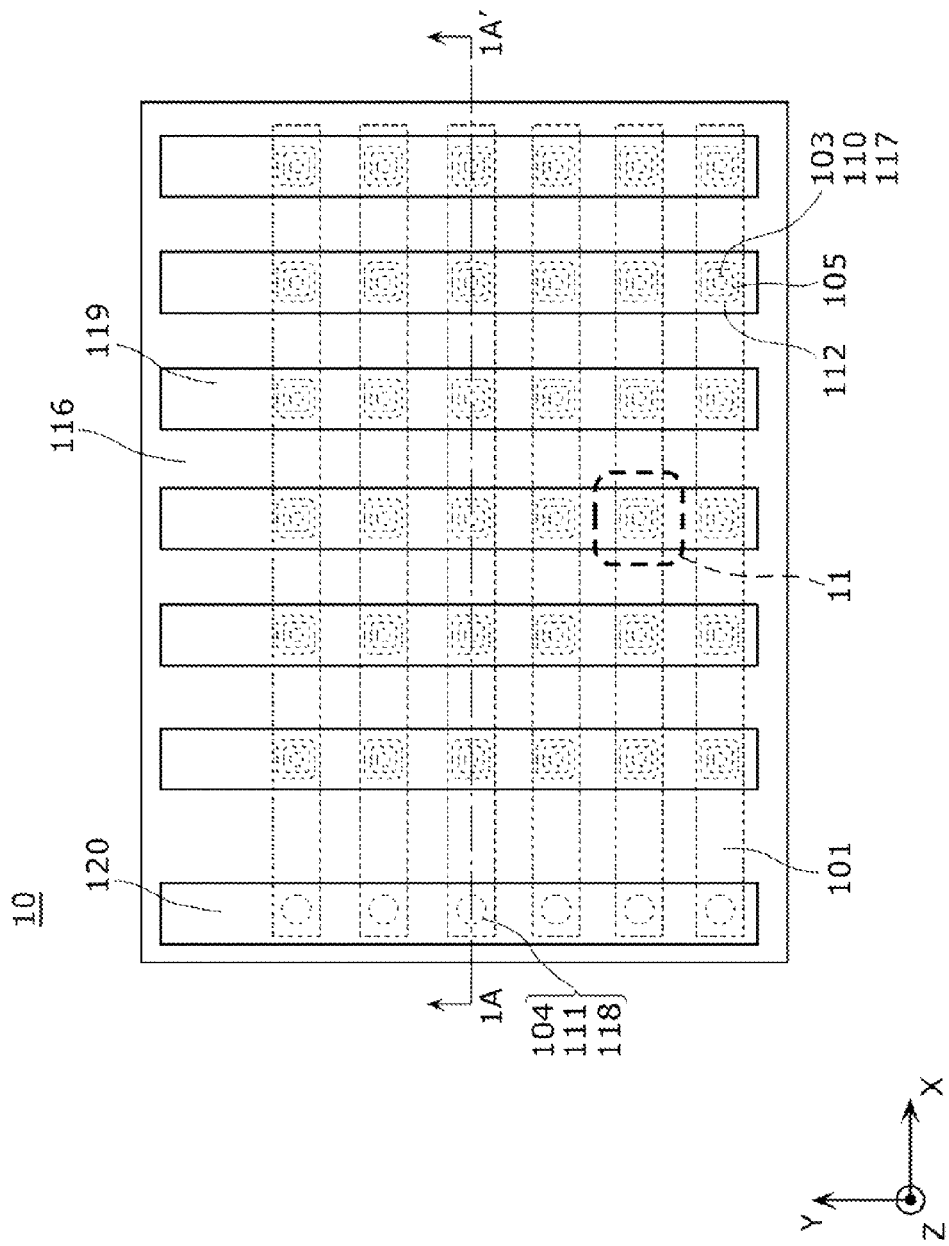

_(1)_

VARIABLE RESISTANCE NONVOLATILE MEMORY DEVICE

TECHNICAL FIELD

The present invention relates to a variable resistance nonvolatile memory device which includes memory cells having current steering elements and variable resistance elements whose resistance values reversibly change according to an electric signal.

BACKGROUND ART

In recent years, the functionality of electronic equipment such as portable information devices and information home appliances has been further improved with the advancement of digital technology. The miniaturization and higher-speed operation of semiconductor elements for use in the electronic equipment are rapidly advancing with the improvement in the functionality of these electronic devices. Among these semiconductor elements, the applications of large-capacity nonvolatile memories represented by flash memories are rapidly expanding. Moreover, research and development are being advanced for variable resistance nonvolatile memory devices including variable resistance elements (ReRAMs) as the next-generation nonvolatile memories expected to replace such flash memories.

Here, the variable resistance element is an element having the characteristics that the resistance value (resistance state) is reversibly changed by applying an electric signal (voltage pulse) and the state is maintained. More specifically, the variable resistance element has a simple structure having a variable resistance layer formed between a first electrode layer and a second electrode layer using a variable resistance material. Information can be preserved in a nonvolatile manner by allocating a piece of the information to each resistance state of the variable resistance element. Specifically, for instance, two values can be preserved by allocating "0" to one of a low resistance state and a high resistance state, and allocating "1" to the other. Here, the low resistance state indicates a relatively low resistance value while the high resistance state indicates a higher resistance value than the low resistance state.

The resistance value of the variable resistance element is changed when the redox state of a variable resistance material is changed directly by electrical stimulation, i.e., through the gain or lose of electrons. This is different from a phase change memory (PCRAM) whose resistance value is changed when crystalline state is changed by heat generated by the electrical stimulation.

A nonvolatile memory device in which 1T1R memory cells are arrayed in a matrix is generally known as a nonvolatile memory device including variable resistance elements. Here, for example, the 1T1R memory cells each include a transistor and a variable resistance element connected in series at a cross point at which a bit line and a word line cross at right angles. Moreover, a crosspoint nonvolatile memory device including 1D1R memory cells arrayed in a matrix and a crosspoint nonvolatile memory device including 1D1R memory cells stacked in a multi-layer structure are known in an effort to achieve higher integration. Here, the memory cells each include a diode element and a variable resistance element connected in series at a cross point at which a bit line and a word line cross at right angles. In addition, the diode element serves as a current steering element for controlling the amount of current when a voltage is applied in the (LR) direction in which a resistance value is changed from a high resistance state to a low resistance state, in the normal operation.

CITATION LIST

Patent Literature

[PTL 1] U.S. Pat. No. 7,869,258
[PTL 2] Japanese Unexamined Patent Application Publication No. 2009-217908

SUMMARY OF INVENTION

Technical Problem

In a nonvolatile memory device including variable resistance elements, to enable the reversible change of a variable resistance layer between a high resistance state and a low resistance state, a forming operation in which an initial breakdown voltage is applied to the variable resistance elements may be performed after the variable resistance elements are formed. In this case, the resistance value of a variable resistance element in an initial state after being formed is much higher than a high resistance value in normal resistance change. It should be noted that the voltage value of an initial breakdown voltage is generally greater in absolute value than the voltage value of an electric signal applied for changing the resistance state of the variable resistance element in the normal operation performed on the nonvolatile memory device. By performing the forming operation, the resistance of the variable resistance element changes between a high resistance state and a low resistance state according to a voltage applied between an upper electrode and a lower electrode. Here, the high resistance state has a resistance value lower than the initial resistance value of the variable resistance element immediately after being formed. The low resistance state has a lower resistance value than the high resistance state.

In the forming operation, an initial breakdown voltage higher than a voltage applied in the normal operation is applied, and the resistance value of the variable resistance element is abruptly decreases. Therefore, there is a problem in that an excessively large current flows in the application of an initial breakdown voltage, and the resistance value of the variable resistance element falls too low after the initial breakdown. In this case, when the normal writing operation is performed after the forming operation, a necessary voltage is not applied, and an operation for changing resistance cannot be performed.

Therefore, an object of the present invention is to provide a crosspoint nonvolatile memory device which includes variable resistance elements, and is able to satisfyingly limit a current in the forming operation.

Solution to Problem

To solve the above problem, a variable resistance nonvolatile memory device according to an aspect of the present disclosure includes: a plurality of first signal lines and a plurality of second signal lines which cross; a memory cell array including a plurality of memory cells disposed at cross points at which the first signal lines and the second signal lines cross, the memory cells each having an end connected to one of the first signal lines and another end connected to one of the second signal lines; and a write circuit which generates a bipolar voltage to be applied to the memory cells via the first signal lines and the second signal lines; in which the memory cells each further include: a variable resistance element of which a resistance state changes to a low resistance state when a first voltage of a first polarity is applied, and changes to a high resistance state when a second voltage of a second polarity opposite to the first polarity is applied, the high resistance state being higher than the low resistance state in resistance value; and a current steering element in which a first current is larger than a second current, the first current being a current which flows when a voltage of the first polarity having a first value is applied, the first value being a given value less than a predetermined voltage value and having an absolute value greater than zero, the second current being a current which flows when a voltage of the second polarity having an absolute value which is the first value is applied, and in each of the memory cells, the variable resistance element and the current steering element are connected in series.

Advantageous Effects of Invention

According to a variable resistance nonvolatile memory device in the present disclosure, it is possible to satisfyingly limit a current in the forming operation.

BRIEF DESCRIPTION OF DRAWINGS

FIG. 2 is a top view showing an example of the configuration of nonvolatile memory elements and a memory cell array according to an embodiment.

DESCRIPTION OF EMBODIMENTS

Figure 1:
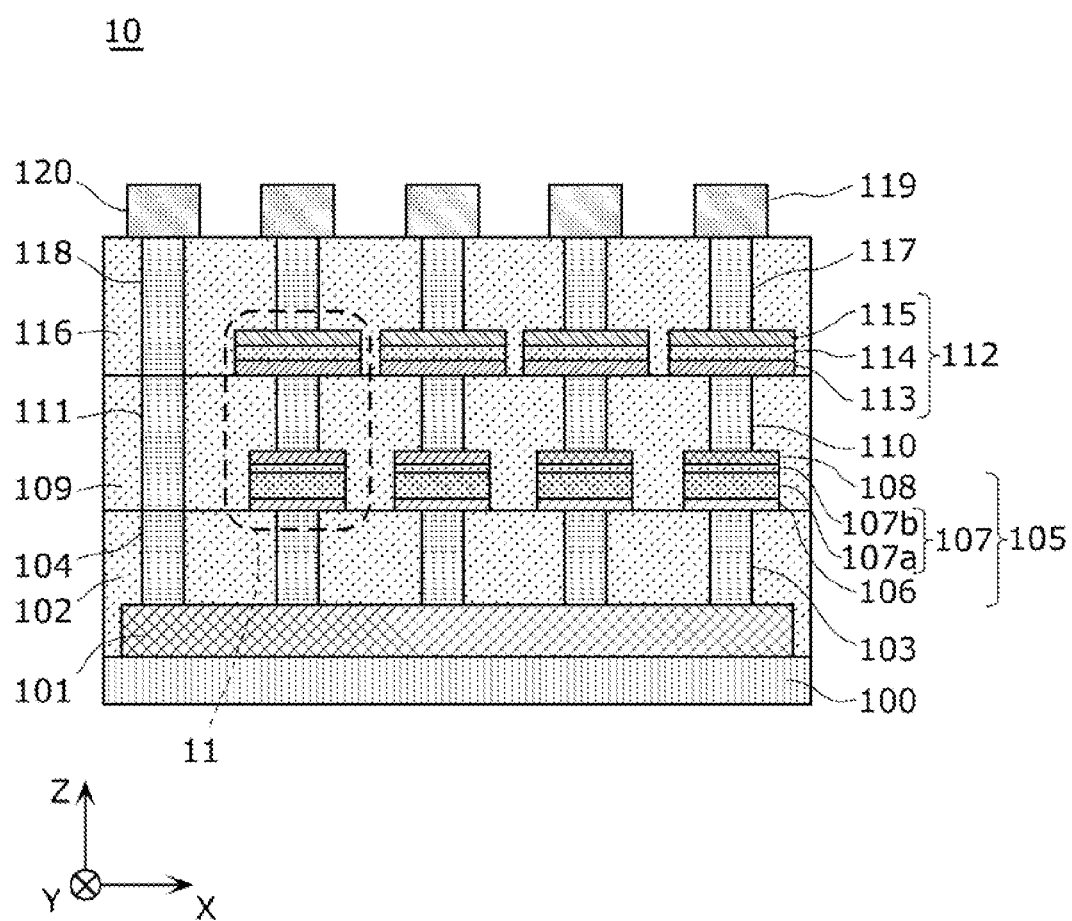
FIG. 1 is a cross-sectional view showing an example of the configuration of nonvolatile memory elements and a memory cell array according to an embodiment.

1. Overview of Variable Resistance Nonvolatile Memory Device and Method of Fabricating the Same A variable resistance nonvolatile memory device according to an aspect of the present invention includes: a plurality of first signal lines and a plurality of second signal lines which cross; a memory cell array including a plurality of memory cells disposed at cross points at which the first signal lines and the second signal lines cross, the memory cells each having an end connected to one of the first signal lines and another end connected to one of the second signal lines; and a write circuit which generates a bipolar voltage to be applied to the memory cells via the first signal lines and the second signal lines; in which the memory cells each further include: a variable resistance element of which a resistance state changes to a low resistance state when a first voltage of a first polarity is applied, and changes to a high resistance state when a second voltage of a second polarity opposite to the first polarity is applied, the high resistance state being higher than the low resistance state in resistance value; and a current steering element in which a first current is larger than a second current, the first current being a current which flows when a voltage of the first polarity having a first value is applied, the first value being a given value less than a predetermined voltage value and having an absolute value greater than zero, the second current being a current which flows when a voltage of the second polarity having an absolute value which is the first value is applied, and in each of the memory cells, the variable resistance element and the current steering element are connected in series.

According to this configuration, in the 1D1R crosspoint variable resistance nonvolatile memory device, current limit when the forming operation is performed on the variable resistance elements in the HR direction can be performed with good followability. This enables a stable forming operation.

For example, the variable resistance nonvolatile memory device may include a first current limiting circuit for limiting a current flowing in a direction in which resistance states of the memory cells are changed to the low resistance state, the first current limiting circuit being provided in a path of a current which flows from the write circuit to the memory cells.

Moreover, the variable resistance nonvolatile memory device may include: a first current limiting circuit for limiting a current flowing in a direction in which resistance states of the memory cells are changed to the low resistance state, the first current limiting circuit being provided in a path of a current which flows from the write circuit to the memory cells; and a second current limiting circuit for limiting a current flowing in a direction in which resistance states of the memory cells are changed to the high resistance state, the second current limiting circuit being provided in a path of the current which flows from the write circuit to the memory cells.

Moreover, a current limit value of the second current limiting circuit may be less than a value of a breakdown current for the current steering element.

Moreover, a current limit value of the second current limiting circuit may be a current value at which the resistance state of the variable resistance element changes to the high resistance state.

Moreover, a current limit value of the first current limiting circuit may be equal to a current limit value of the second current limiting circuit.

Moreover, the write circuit may perform a forming operation on the memory cells after the memory cells are formed and before a normal writing operation is executed, the forming operation being an operation in which a voltage of the second polarity having an absolute value greater than a value of the second voltage is applied.

2. Explanation for Vocabulary and Others

In the embodiments, "oxygen content atomic percentage" is the ratio of the number of oxygen atoms to the total number of atoms making up a metal oxide. For example, the oxygen content atomic percentage of $Ta_2O_5$ is the ratio of the number of oxygen atoms to the total number of atoms (O/(Ta+O)), namely, 71.4 atm %. Therefore, an oxygen-deficient tantalum oxide has an oxygen content atomic percentage from more than zero to less than 71.4 atm %. For instance, when a metal comprised in a first metal oxide layer and a metal comprised in a second metal oxide layer are the same type, the oxygen content atomic percentage has a correspondence relationship with the degree of oxygen deficiency. That is, when the oxygen content atomic percentage of the second metal oxide is greater than that of the first metal oxide, the degree of oxygen deficiency of the second metal oxide is less than that of the first metal oxide.

In a metal oxide, the "degree of oxygen deficiency" is the ratio of deficient oxygen to the amount of oxygen of an oxide having a stoichiometric composition (when there is more than one stoichiometric composition, the one which has the highest resistance value is chosen). A metal oxide having the stoichiometric composition has a more stable and higher resistance value than metal oxides of other compositions.

For example, when the metal is tantalum (Ta), a metal oxide having the stoichiometric composition according to the above definition is $Ta_2O_5$. Thus, $Ta_2O_5$ is expressed as $TaO_{2.5}$. The degree of oxygen deficiency of $TaO_{2.5}$ is 0%. The degree of oxygen deficiency of $TaO_{1.5}$ is expressed as the degree of oxygen deficiency=(2.5−1.5)/2.5=40%. Moreover, a metal oxide with excessive oxygen has a negative value in the degree of oxygen deficiency. It should be noted that this description is based on the assumption that the degree of oxygen deficiency ranges from a positive value, to zero, to a negative value unless otherwise mentioned.

Since an oxide having a low degree of oxygen deficiency is closer to an oxide having the stoichiometric composition, the resistance value is high. Since an oxide having a high degree of oxygen deficiency is closer to a metal of the oxide, the resistance value is low.

"Oxygen-deficient metal oxide" is a metal oxide having less oxygen content (atom ratio: ratio of the number of oxygen atoms to the total number of atoms) than a metal oxide having the stoichiometric composition.

A "metal oxide of stoichiometric composition" is a metal oxide with an oxygen deficiency degree of 0%.

"Standard electrode potential" is an indication showing how easily it is oxidized. When this value is large, it is not likely to be oxidized. When this value is small, it is likely to be oxidized.

A "current steering element" is an element which has the following feature. In a predetermined voltage range, resistance is low, and a current flows well. In the other voltage range, the resistance is high, and a current does not flow well. The "current steering element" is largely categorized into a unidirectional diode and a bidirectional diode. When the unidirectional diode is a general diode and a voltage higher than or equal to a predetermined threshold voltage of a predetermined polarity is applied, the resistance is low, and a current flows well. In the other voltage range, the resistance is high, and a current does not flow well. Representative unidirectional diodes are, for example, a pn junction diode and a Schottky diode. The bidirectional diode has two current-voltage characteristics. In a first current-voltage characteristic (monotone increase), whether an electric signal of a first polarity (e.g., negative polarity) or an electric signal of a second polarity (e.g., positive polarity) is applied, the absolute value of a flowing current increases with an increase in the absolute value of an applied voltage. In a second current-voltage characteristic (non-linear current-voltage characteristic), the rate of current change to voltage change (gradient: rate of change in absolute value of current/rate of change in absolute value of voltage) increases with an increase in the absolute value of an applied voltage. Representative bidirectional diodes are, for example, an MIM diode, an MSM diode, and a varistor.

3. Background of Invention and Others

In the variable resistance element for use in the 1D1R memory cell described above, low resistance writing and high resistance writing are performed in the normal operation. In the low resistance writing, the resistance state of the variable resistance element changes from a high resistance state to a low resistance state. In the high resistance writing, the resistance state of the variable resistance element changes from the low resistance state to the high resistance state.

Here, in the low resistance state, the resistance value of the variable resistance element belongs to a first range lower in resistance value than the high resistance state. In the high resistance state, the resistance value of the variable resistance element belongs to a second range higher in resistance value than the low resistance state. Generally, in the variable resistance element, the first range of low resistance state and the second range of high resistance state are different by one order of magnitude.

It should be noted that in the low resistance writing, when the resistance state changes from the high resistance state to the low resistance state, a resistance value decreases by around one order of magnitude. Therefore, an abrupt change is seen in a current.

Therefore, various approaches for controlling current change in memory cells in the normal writing operation, especially in the low resistance writing, in a crosspoint nonvolatile memory device including such variable resistance elements have been suggested (e.g., PTLs 1 and 2).

Specifically, PTL 1 suggests an approach for limiting a writing current when writing is performed on 1D1R memory cells in the normal writing such that the resistance state of the variable resistance element changes from the high resistance state to the low resistance state (normal low resistance writing).

Figure 9:
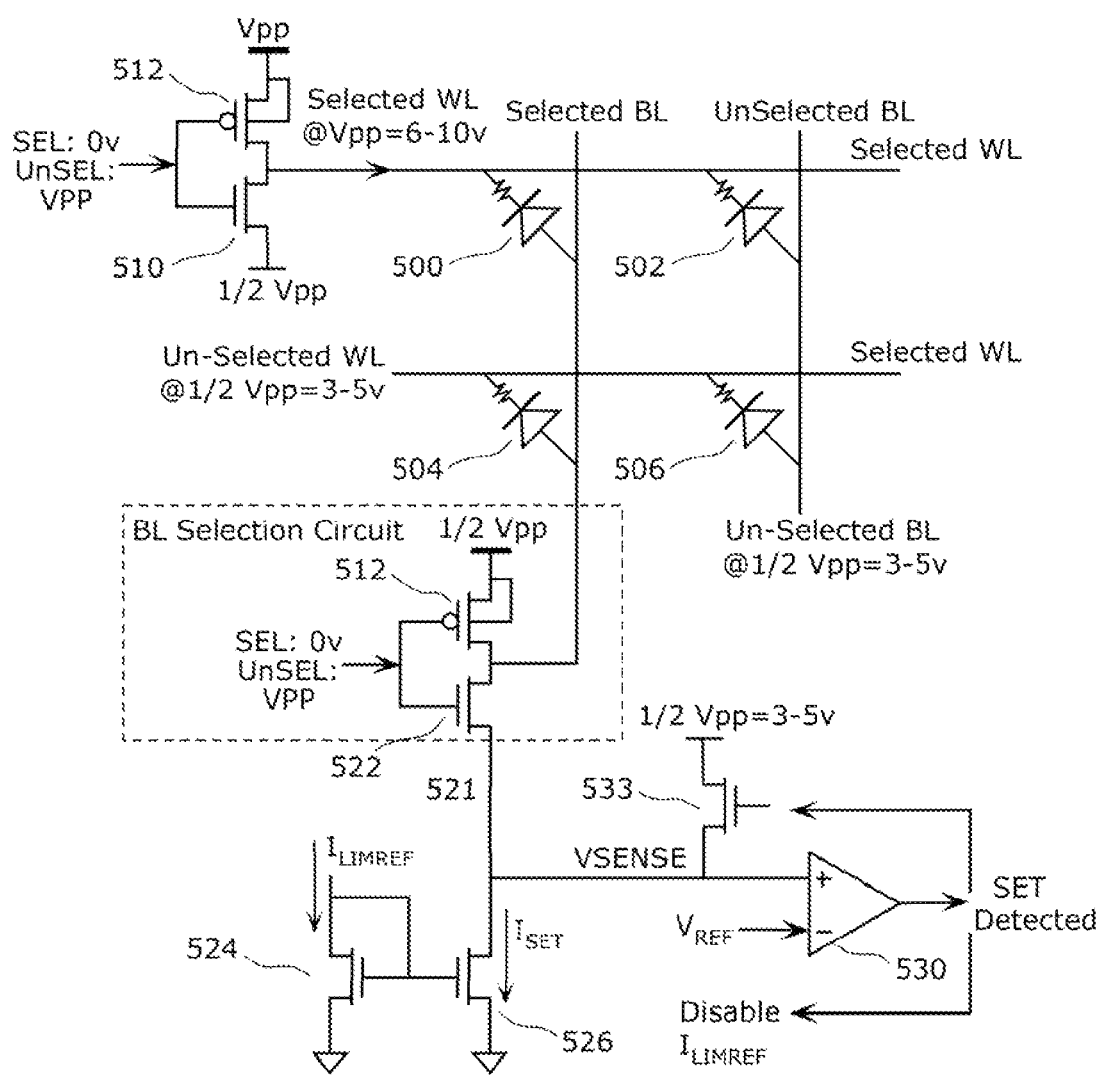
FIG. 9 is a circuit diagram showing the configuration of the conventional memory cell array and its peripheral circuitry.
Figure 10:
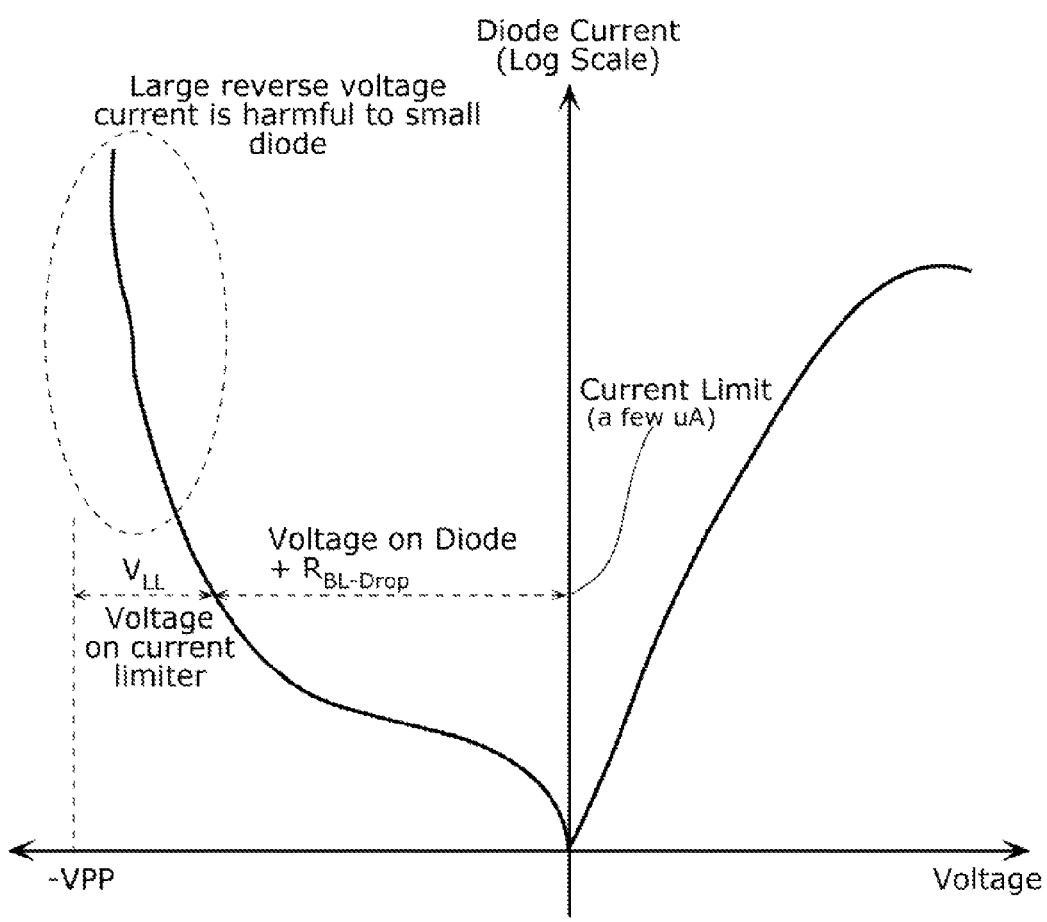
FIG. 10 is a graph showing the current-voltage characteristics of a current steering element in the conventional memory cell array.

Here, FIG. 9 is a circuit diagram showing the configuration of the memory cell array and its peripheral circuitry in a crosspoint nonvolatile memory device including 1D1R memory cells recited in PTL 1, FIG. 10 shows the current-voltage characteristics of a current steering element of a 1D1R memory cell recited in PTL 1.

As shown in FIG. 9, in the memory cell in PTL 1, a unidirectional diode is used as the current steering element of the memory cell, and the reverse bias direction of the unidirectional diode corresponds to the polarity at which the resistance of the variable resistance element is decreased. By configuring the memory cell in this way, it is shown that current change can be controlled when the low resistance writing is performed on the variable resistance element in the normal operation and the resistance state of the variable resistance element changes to the low resistance state. Moreover, it is shown that the current limiting circuit provided in the peripheral circuitry (lower part of FIG. 9) suppresses current change when the resistance state of the variable resistance element changes to the low resistance state.

PLT 2 suggests an approach fore limiting a writing current by the current limiting circuit provided outside of the memory cell array when writing is performed on a memory cell including a unipolar variable resistance element such that the resistance state of the variable resistance element changes from the low resistance state to the high resistance state (high resistance writing).

Figure 11:
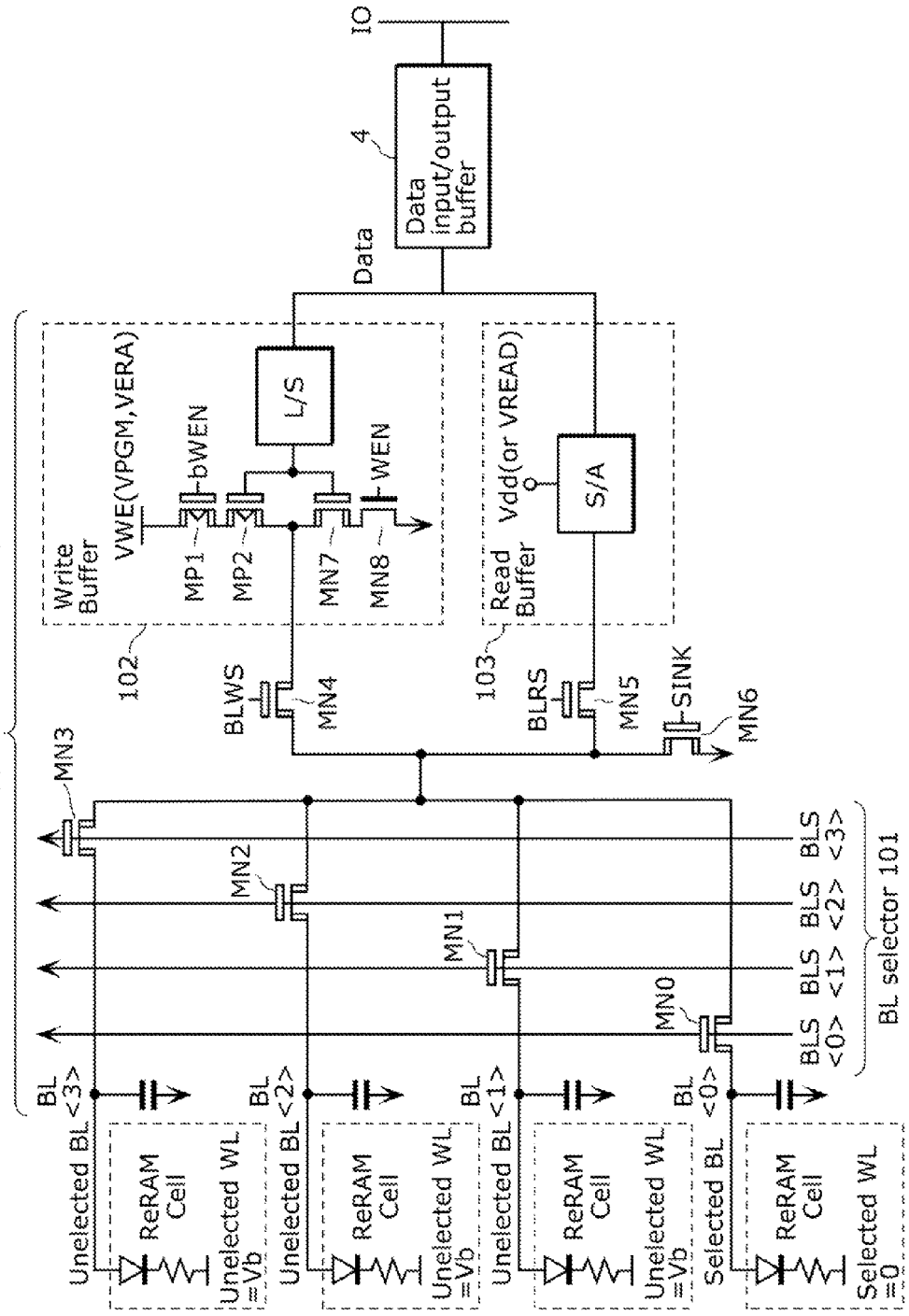
FIG. 11 is a circuit diagram showing the configuration of the conventional memory cell array and its peripheral circuitry.
Figure 12:
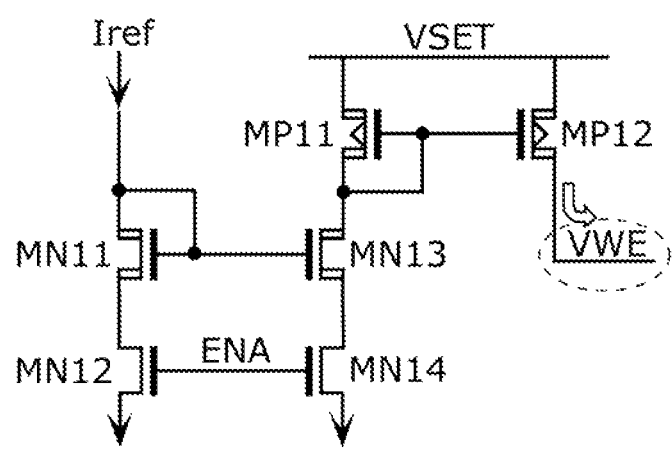
FIG. 12 is a circuit diagram showing the configuration of the conventional peripheral circuitry.

Here, FIG. 11 is a circuit diagram showing the configuration of the memory cell array and its peripheral circuitry in a crosspoint nonvolatile memory device including 1D1R memory cells recited in PTL 1. FIG. 12 is a circuit diagram showing the configuration of the current limiting circuit provided in the peripheral circuitry in the nonvolatile memory device recited in PTL 2.

As shown in FIGS. 11 and 12, in PTL 2, when the high resistance writing is performed on the variable resistance element in the normal operation, the current limiting circuit provided outside of the memory cell array shown in FIG. 12 is used. By so doing, a high voltage is applied when the resistance state of the variable resistance element changes to the high resistance state. This prevents resistance from decreasing again.

As described above, PTLs 1 and 2 show nonvolatile memory devices which limit a current in the low or high resistance writing during the normal operation.

4. Explanation for Forming Operation

As described above, in the nonvolatile memory device including a variable resistance element having a variable resistance layer formed, using a variable resistance material, between the first electrode layer and the second electrode layer, a forming operation may be performed once at the beginning after the fabrication such that the resistance state of the variable resistance layer can be reversibly changed between a high resistance state and a low resistance state.

The inventors et al. of this application are considering a method for the forming operation performed on variable resistance elements in a crosspoint memory cell array made up of 1D1R memory cells each including a bidirectional diode element and a bipolar variable resistance element.

In the 1D1R crosspoint memory cell array, the forming operation is performed generally in the LR direction in which a voltage is applied in the same direction as the direction in which a low resistance writing is performed in the normal operation in order to change the resistance state of the variable resistance element from a first resistance state to a second resistance state. Here, the first resistance state has a higher resistance value than a high resistance state in the normal operation. The second resistance state has a lower resistance value than the first resistance state. In the forming operation in the LR direction, a voltage is applied in the LR direction assuming that the low resistance state in the normal operation is the second resistance state, for example.

However, in resistance value, the first resistance state is generally more than two orders of magnitude higher than the high resistance state and more than three orders of magnitude higher than the lower resistance state. That is, in the forming operation in the LR direction, the resistance value rapidly drops by more than three orders of magnitude when the forming of the variable resistance element is performed. Therefore, it is difficult to stably control the resistance value after the forming operation, and there is a problem in that the resistance vale falls too low according to the properties of a variable resistance element and the configuration of a peripheral circuitry. In this case, when the normal writing operation is performed after the forming operation, a problem that a voltage cannot be applied to the variable resistance element and an operation for changing resistance cannot be performed is caused.

Moreover, in the forming operation in the LR direction, a resistance value rapidly falls by more than three orders of magnitude. Therefore, when the forming of the variable resistance element is performed, a current which flows through a memory cell rapidly increases. Thus, when a current larger than a tolerable amount for a diode of a memory cell flows through the memory cell, the diode may be broken by the current.

Meanwhile, the inventors et al. of this applications are considering the forming operation in the HR direction in which a voltage is applied in the same direction as the direction in which high resistance writing is performed in the normal operation. In the forming operation in the HR direction, a voltage is applied in the HR direction based on the assumption that a high resistance state in the normal operation is the second resistance state. Therefore, the amount of change in the resistance value of the variable resistance element is smaller than that in the forming operation in the LR direction. This can prevent the resistance value of the variable resistance element from falling too low. Moreover, in the forming operation in the LR direction, there is a problem in that when the resistance value of the variable resistance element drops too low and becomes lower than the resistance value of the low resistance state, the resistance value of the variable resistance element cannot be returned to a variable resistance value. This makes the variable resistance element defective. Meanwhile, in the forming operation in the HR direction, it is possible to reduce the number of variable resistance elements to be defective. This is because a target resistance state is a high resistance state in the forming operation in the HR direction, and the current which flows when the resistance state is changed to the high resistance state is smaller than the current which flows in the forming operation in the LR direction in which a target resistance state is a low resistance state.

However even for the forming operation in the HR direction, when the forming of the variable resistance element is performed, the resistance value of the variable resistance element drops by more than two orders of magnitude, and a current which flows through a memory cell rapidly increases. Therefore, also for the forming operation in the HR direction, it is necessary to suppress a rapid increase in the current which flows through the memory cell.

Moreover, the absolute value of a voltage used in the forming operation in the HR direction is larger than that of a voltage used in the forming operation in the LR direction. Therefore, in the forming operation in the HR direction, a current which flows through a memory cell may rapidly increase, compared to a current which flows through a memory cell in the forming operation in the LR direction.

Furthermore, even for the forming operation in the HR direction, a resistance value may fall too low, and the resistance value may become lower than the resistance value of a high resistance state (low resistance state). In this case, considering that a voltage to be applied is high, a current which flows through a memory cell may rapidly increase.

It should be noted that in PTL 1, when a voltage is applied in the LR direction by a diode provided in a memory cell, current change can be suppressed. However, when a voltage is applied in the HR direction, it is difficult to suppress current change. It should be noted that even if the configuration in PTL 1 is employed, a problem remains that a current cannot be limited in the forming operation in the HR direction and stable forming cannot be performed.

Meanwhile, a current limiting circuit used when the high resistance writing in the normal operation recited in PTL 2 is performed can suppress to some extent current change when a voltage is applied in the HR direction. However, since the current limiting circuit is provided outside of the memory cell array, the followability for current change is limited, compared to the case when a current changing element is provided in a memory cell as shown in PTL 1. Since current change during the forming operation is rapid, a problem in the current limiting circuit recited in PTL 2 is in that the followability of current change in the forming operation in the HR direction is not enough and a stable forming cannot be performed.

The following describes embodiments with reference to drawings. It should be noted that each of the embodiments described below describes a preferable specific example of the present invention. The numerical values, shapes, materials, structural elements, the arrangement and connection of the structural elements, steps, the processing order of the steps and so on shown in the following embodiments are mere examples, and are not intended to limit the present invention. Among the structural elements in the following embodiments, structural elements not recited in any one of the independent claims representing superordinate concept are used to form a more preferable embodiments.

5. Embodiment 1

The following describes a nonvolatile memory device (variable resistance nonvolatile memory device) according to Embodiment 1 with reference to the drawings.

The nonvolatile memory device according to the present embodiment includes memory cells each including a variable resistance element and a current steering element which are connected in series. Here, the current steering element can limit a current when a voltage is applied in the HR direction.

[5-1. Configuration of Memory Cell Array]

With reference to FIGS. 1 and 2, the following describes the configurations of a memory cell array making up the nonvolatile memory device and memory cells making up the memory cell array.

FIG. 1 is a cross-sectional view showing a configuration example of the memory cell array among structural elements in the nonvolatile memory device according to the present embodiment. FIG. 2 is a top view showing an example of the schematic configuration of nonvolatile memory elements and a nonvolatile memory device according to Embodiment 1 in the present invention. The cross-sectional view when the cross section in the alternate long and short dash line shown in 1A-1A' in FIG. 2 is viewed in the arrow direction corresponds to FIG. 1.

As shown in FIGS. 1 and 2, a memory cell array 10 in the present embodiment schematically includes a substrate 100, first lines 101, second lines 119, and memory cells 11. The first lines 101 are arranged parallel to each other and each extend in the X direction (horizontal direction in FIGS. 1 and 2), on the main surface of the substrate 100. In a plane parallel to the main surface of the substrate 100, the second lines 119 are, above the first lines 101, arranged parallel to each other and each extend in the Y direction (vertical direction in the paper for FIG. 1 and top and bottom direction in FIG. 2), and cross the first lines 101 in three-dimensions. The memory cells 11 each correspond to one of the three-dimensional cross points at which the first lines 101 and the second lines 119 cross in three-dimensions to connect (electrically connect (the same hereinafter)) the first lines 101 and the second lines 119.

The memory cells 11 each include a variable resistance element 105, a current steering element 112, and a third contact plug 110 which connects the variable resistance element 105 and the current steering element 112.

The variable resistance element 105 includes a lower electrode 106 (first electrode), an upper electrode 108 (second electrode), and a variable resistance layer 107 formed between the lower electrode 106 and the upper electrode 108. The lower electrode 106 and the variable resistance layer 107 are physically in contact. The upper electrode 108 and the variable resistance layer 107 are physically in contact.

The current steering element 112 is a current steering element having a current limiting function when resistance is increased, and includes a first electrode 113, a second electrode 115, and a semiconductor layer 114 formed between the first electrode 113 and the second electrode 115. The first electrode 113 and the semiconductor layer 114 are physically in contact. The second electrode 115 and the semiconductor layer 114 are physically in contact.

It should be noted that in Embodiment 1, it is assumed that the variable resistance element 105 and the current steering element 112 which make up the memory cell 11 are connected via the third contact plug 110. However, other cases can be also considered. For example, the upper electrode 108 of the variable resistance element 105 and the first electrode 113 of the current steering element 112 may be directly connected or the same electrode may be shared by the upper electrode 108 and the first electrode 113. Moreover, in the present embodiment, the current steering element 112 is provided above the variable resistance element 105. However, the variable resistance element 105 may be provided above the current steering element 112.

More specifically, in the memory cell array 10, the first lines 101 are formed in the X direction on the substrate 100, and a first interlayer insulating layer 102 is formed to cover the first lines 101. The variable resistance elements 105 are formed on the first interlayer insulating layer 102 so as to be spaced apart at regular intervals above the first line 101 when viewed from the Z direction (direction in which the first line 101 is stacked, i.e., top-down direction of FIG. 1). The first lines 101 and the lower electrodes 106 of the variable resistance elements 105 above the first lines 101 are connected via first contact plugs 103 which penetrate through the first interlayer insulating layer 102.

A second interlayer insulating layer 109 is formed on the first interlayer insulating layer 102 so as to cover the variable resistance element 105. The current steering elements 112 are formed on the second interlayer insulating layer 109 so as to coincide with the variable resistance elements 105 when viewed from the Z direction. The third contact plug 110 connects (shorts) the upper electrode 108 of the variable resistance element 105 and the first electrode 113 of the current steering element 112 without the variable resistance layer 107 and the semiconductor layer 114.

A third interlayer insulating layer 116 is formed on the second interlayer insulating layer 109 so as to cover the current steering elements 112. The second lines 119 are formed on the third interlayer insulating layer 116 so as to cross the first lines 101 and coincide with the variable resistance elements 105 and the current steering elements 112 when viewed from the X direction. The second lines 119 and the second electrodes 115 of the current steering elements 112 below the second lines 119 are connected via fifth contact plugs 117 which penetrate through the third interlayer insulating layer 116.

Moreover, on the third interlayer insulating layer 116, a lead-out line 120 is formed outside of the area where the memory cells 11 are arranged, when viewed in the Z direction, and parallel to the second lines 119, i.e., in the Y direction. The first lines 101 and the lead-out line 120 are connected via (i) second contact plugs 104 penetrating through the first interlayer insulating layer 102, (ii) fourth contact plugs 111 penetrating through the second interlayer insulating layer 109, and (iii) sixth contact plugs 118 penetrating through the third interlayer insulating layer 116. That is, the second contact plug 104, the fourth contact plug 111, and the sixth contact plug 118 are stacked in this order to be connected to each other, and form a stack contact. Thus, the second contact plug 104, the fourth contact plug 111, and the sixth contact plug 118 connect the first lines 101 and the lead-out line 120.

The first lines 101, the second lines 119, and the lead-out line 120 are, for example, made of aluminum. The first interlayer insulating layer 102, the second interlayer insulating layer 109, and the third interlayer insulating layer 116 are, for example, made of oxide silicon. The first contact plugs 103, the second contact plugs 104, the third contact plugs 110, the fourth contact plugs 111, the fifth contact plugs 117, and the sixth contact plugs 118 are, for example, made of tungsten.

According to this configuration, a nonvolatile memory device is achieved which includes a crosspoint memory cell array in which the memory cells 11, when the memory cell array 10 is viewed from the vertical direction, are each provided at one of the three-dimensional cross points at which the first lines 101 crosses the second lines 119.

[5-2. Configuration of Variable Resistance Element]

As described above, the variable resistance element 105 according to the present embodiment includes the lower electrode 106, the upper electrode 108, and the variable resistance layer 107 formed between the lower electrode 106 and the upper electrode 108.

The variable resistance layer 107 is formed between the lower electrode 106 and the upper electrode 108, and the resistance value of the variable resistance layer 107 reversibly changes according to an electric signal applied between the lower electrode 106 and the upper electrode 108. For example, the resistance state of the variable resistance layer 107 reversibly changes between a high resistance state and a low resistance state according to the polarity of a voltage applied between the lower electrode 106 and the upper electrode 108. The variable resistance layer 107 is formed by depositing a variable resistance material containing an oxygen-deficient metal oxide, for example, at a thickness of 30 nm. The variable resistance layer 107 may be formed of a variable resistance material containing an oxygen-deficient tantalum oxide ($TaO_x$: $0<x<2.5$). It should be noted that a tantalum oxide is used as an example in the present embodiment. However, other metal oxides such as an oxygen-deficient hafnia ($HfO_x$: $0<x<2$) may be used.

These variable resistance layers have reversibly stable rewriting characteristics. Therefore, a nonvolatile memory element which takes advantage of variable resistance phenomena can be obtained. Examples for the tantalum oxide and the hafnia are detailed in WO2008/059701 (related patent application 1, patent literature) and WO2009/050861 (related patent application 2 patent literature), respectively.

A transition metal or aluminum (Al) can be used as the metal which forms the variable resistance layer 107. A metal such as tantalum (Ta), titanium (Ti), hafnium (Hf), zirconium (Zr), niobium (Nb), tungsten (W), or nickel (Ni) can be used as the transition metal. Since the transition metal can be in different oxidation states, different resistance states can be achieved by oxidation-reduction reaction.

More specifically, the variable resistance layer 107 includes a first variable resistance layer 107a and a second variable resistance layer 107b which are stacked in the film thickness direction. The first variable resistance layer 107a has a higher degree of oxygen deficiency. The second variable resistance layer 107b has a lower degree of oxygen deficiency. The first variable resistance layer 107a is in contact with the lower electrode 106 while the second variable resistance layer 107b is in contact with the upper electrode 108. It is considered that the preferable degree of oxygen deficiency for the second variable resistance layer 107b is around zero. However, oxygen may be contained excessively compared to oxygen in stoichiometric composition. The application of an initial breakdown voltage to the variable resistance element 105 including the variable resistance layer 107 configured as above would cause the following. A conductive path (including a filament) having a higher degree of oxygen deficiency than the second variable resistance layer 107b is formed in the second variable resistance layer 107b. An oxidation reaction or a reductive reaction occurs in the conductive path according to the polarity of a voltage to be applied. Therefore, the resistance value of the variable resistance element 105 changes.

A first metal forming the first variable resistance layer 107a and a second metal forming the second variable resistance layer 107b may be different metals. In this case, the second variable resistance layer has a lower degree of oxygen deficiency, i.e., a higher resistance than the first metal oxide. In such a configuration, a voltage applied between the lower electrode and the upper electrode during resistance change is distributed more to the second variable resistance layer. This can more easily cause the oxidation-reduction reaction which occurs in the second variable resistance layer.

Moreover, when different materials are used for the first metal forming a first metal oxide to be the first variable resistance layer and the second metal forming a second metal oxide to be the second variable resistance layer, the second metal may have a lower standard electrode potential than the first metal. The standard electrode potential shows the characteristic that the higher the value is, the less likely the metal is to be oxidized. Therefore, the oxidation-reduction reaction is more likely to occur in the second metal oxide having a relatively-low standard electrode potential. It should be noted that in the variable resistance phenomena, when the oxidation-reduction reaction occurs in a very small local area formed in the high-resistance second metal oxide and a filament (conductive path) is changed, the resistance value (degree of oxygen deficiency) of the second metal oxide changes.

For example, a stable operation for changing resistance can be achieved by using an oxygen-deficient tantalum oxide ($TaO_x$) for the first metal oxide and using a titanium oxide ($TiO_2$) for the second metal oxide. Titanium (standard electrode potential=−1.63 eV) has a lower standard electrode potential than tantalum (standard electrode potential=−0.6 eV). Thus, the oxidation-reduction reaction is more likely to occur in the second metal oxide by using, for the second metal oxide, a metal oxide having a lower standard electrode potential than the first metal oxide. As another combination, an aluminum oxide ($Al_2O$) can be used for the second metal oxide to be a high-resistance layer. For example, the oxygen-deficient tantalum oxide ($TaO_x$) and the aluminum oxide ($Al_2O_3$) may be used for the first metal oxide and the second metal oxide, respectively.

When the standard electrode potential of a lower electrode material forming the lower electrode 106 is V1, the standard electrode potential of an upper electrode material forming the upper electrode 108 is V2, and the standard electrode potential of a metal forming an oxygen-deficient metal oxide contained in the variable resistance layer 107 is Vt, the lower electrode 106 and the upper electrode 108 are made of materials satisfying the relationships: Vt<V2 and V1<V2.

When Vt<V2 is satisfied, the upper electrode material is less likely to be oxidized than the variable resistance material. As a result, when electrons are gained or lost in the interface between the upper electrode 108 and the variable resistance layer 107, the upper electrode material forming the upper electrode 108 is not oxidized or reduced, and the variable resistance material forming the variable resistance layer 107 is oxidized and reduced. This changes the oxidation state of the variable resistance layer 107, and variable resistance phenomena appear. Furthermore, when V1<V2 is satisfied, oxidation and reduction reactions in the electrode interface are more likely to appear on the upper electrode 108 side. That is the interface in which the variable resistance phenomena appear can be kept on the upper electrode 108 side.

As a material for the lower electrode 105, a material having a lower standard electrode potential than the metal forming the first metal oxide to be the first variable resistance layer 107a can be used. The material, for example, includes tantalum nitride (TaN), tungsten (W), nickel (Ni), tantalum (Ta), titanium (Ti), aluminum (Al), and titanium nitride (TIN). As a material for the upper electrode 108, a material having a higher standard electrode potential than a material forming the lower electrode and the metal forming the second metal oxide to be the second variable resistance layer 107b can be used. The material used for the upper electrode 108, for example, includes platinum (Pt), iridium (Ir), and palladium (Pd). In Embodiment 1, the standard electrode potential V1 of the tantalum nitride is 0.48 V. The standard electrode potential V2 of platinum or iridium which is an upper electrode material is around 1.1 V. The standard electrode potential Vt of the tantalum oxide which is a variable resistance material is −0.6 V. Therefore, the relationships: Vt<V2 and V1<V2 are satisfied.

It should be noted that when the hafnia is used for the variable resistance material, the standard electrode potential Vt of hafnium is −1.55 V. Therefore, even if the hafnia is used, as long as the upper electrode material and the lower electrode material described above are used, the relationships: Vt<V2 and V1<V2 are satisfied.

In the high resistance (HR) writing in the normal operation, a positive voltage (electric signal of positive polarity, voltage pulse in HR direction) relative to a voltage applied to the lower electrode 106 is applied to the upper electrode 108. Here, a current flows from the upper electrode 108 to the lower electrode 106. This transfers electrons from the conductive path in the second variable resistance layer 107b to the upper electrode 108. Therefore, the variable resistance material forming the conductive path is oxidized, and the resistance value increases.

In the low resistance (LR) writing in the normal operation, a negative voltage (electric signal of negative polarity, voltage pulse in LR direction) relative to a voltage applied to the lower electrode 106 is applied to the upper electrode 108. Here, a current flows from the lower electrode 105 to the upper electrode 108. This transfers electrons from the upper electrode 108 to the conductive path. Therefore, the variable resistance material forming the conductive path is reduced, and the resistance value decreases.

[5-3. Characteristics of Variable Resistance Element Itself: Characteristics During Forming Operation in HR Direction]

Figure 3A:
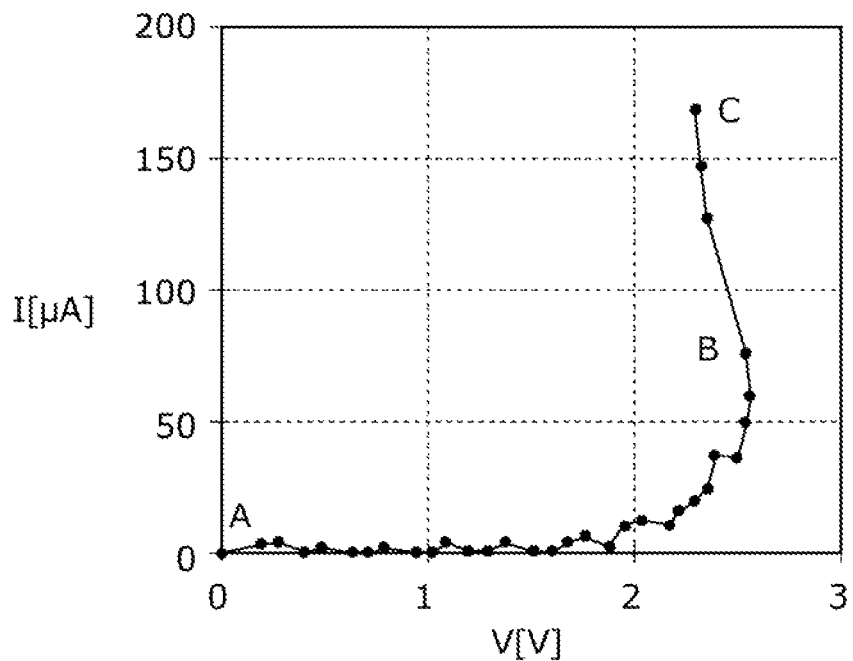
FIG. 3A is a graph showing the current-voltage characteristics of a variable resistance element itself included in a variable resistance nonvolatile memory device according to an embodiment, in a forming operation in the HR direction.
Figure 3B:
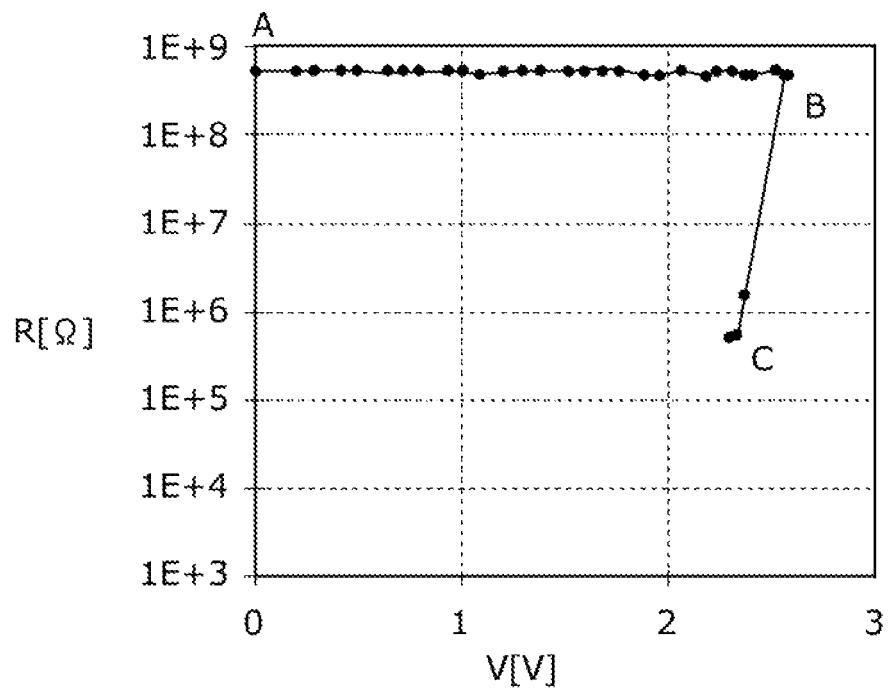
FIG. 3B is a graph showing the relationship between a resistance value and a voltage in a forming operation in the HR direction performed only by a variable resistance element included in a variable resistance nonvolatile memory device according to an embodiment.

With reference to FIGS. 3A and 3B, the following describes the characteristics of the variable resistance element 105 itself (i.e, without the current steering element 112) during the forming operation in the HR direction.

Here, with reference to FIGS. 3A and 3B, the following describes, when the tantalum oxide ($TaO_x$: 0<x<2.5) is used for a variable resistance material forming the variable resistance layer 107, the characteristics of the variable resistance element 105 during the forming operation in the HR direction.

FIG. 3A is a graph showing an example of the current-voltage characteristics of the variable resistance element during the forming operation. FIG. 3B is a graph showing the relationship between a resistance value and a voltage during the forming operation in the HR direction performed on the variable resistance element 105.

As shown in FIG. 3A, a positive voltage (initial breakdown voltage in the HR direction) relative to the lower electrode 106 is applied to the upper electrode 108 such that the absolute value of the voltage gradually increases. The forming of the variable resistance element is performed around 2.55 V (point B), and a current rapidly increases from 75 µA to 125 µA. FIG. 3B shows the resistance values of the variable resistance element 105 when a voltage is applied to the variable resistance element 105 and 0.4 V is applied again, at each point in FIG. 3A.

As it is clear from FIG. 3B, when the forming of the variable resistance element 105 is performed, the resistance value rapidly drops by more than two orders of magnitude.

Therefore, even for the forming operation in the HR direction, it is difficult for only the variable resistance element 105 to stably control the resistance value after the forming operation.

[5-4. Characteristics of Variable Resistance Element Itself: Characteristics During Normal Writing Operation]

Figure 4A:
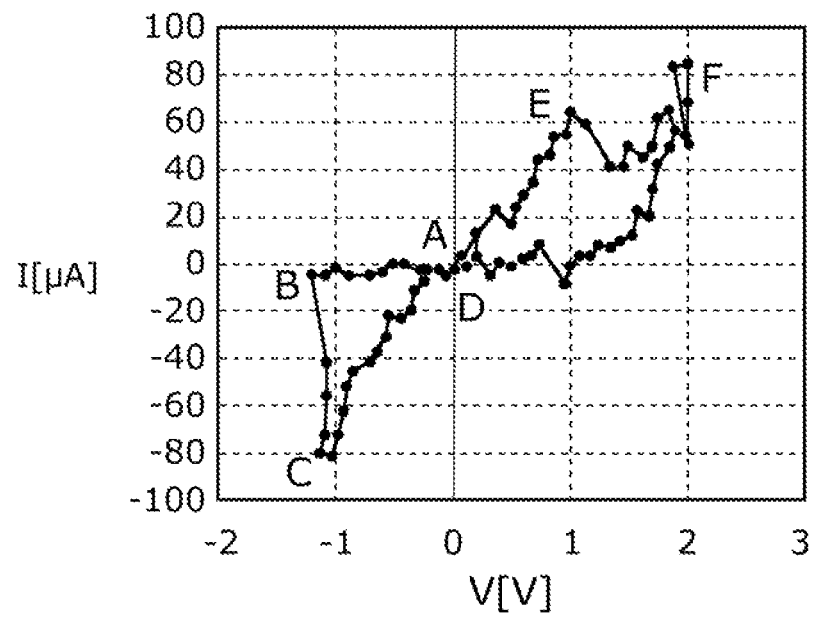
FIG. 4A is a graph showing current-voltage characteristics of a variable resistance element itself included in a variable resistance nonvolatile memory device according to an embodiment, in a normal writing operation.
Figure 4B:
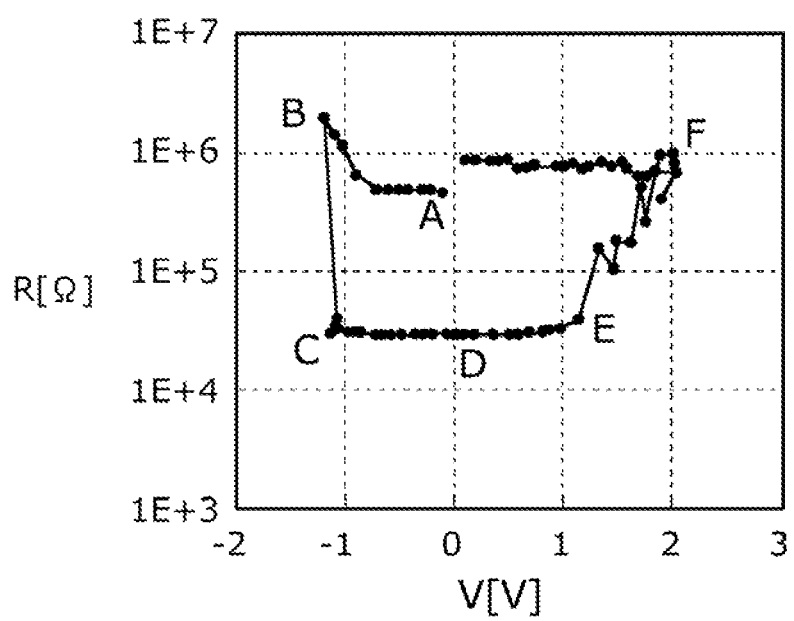
FIG. 4B is a graph showing the relationship between a resistance value and a voltage in a normal writing operation performed only by a variable resistance element included in a variable resistance nonvolatile memory device according to an embodiment.

With reference to FIGS. 4A to 4C, the following describes the characteristics of the variable resistance element 105 itself (i.e., without the current steering element 112) during, the normal writing operation.

Here, with reference to FIGS. 4A to 4C, the following describes the characteristics of the variable resistance element 105 during the normal writing operation when a tantalum oxide (TaO$_x$: 0<x<2.5) is used for a variable resistance material forming the variable resistance layer 107.

FIG. 4A is a graph showing an example of the current-voltage characteristics of the variable resistance element 105 itself during the normal writing operation. FIG. 4B is a graph showing the relationship between a resistance value and a voltage (writing voltage) during the normal writing operation performed on the variable resistance element itself.

Low resistance writing is performed on the variable resistance element 105 in a high resistance state (state at point A), i.e., a negative voltage (writing voltage in LR direction) relative to the lower electrode 106 is applied to the upper electrode 108 such that the absolute value of the voltage gradually increases. The resistance state changes in the direction from point A to point B, and changes from the high resistance state (state at point B) to a low resistance state (state at point C) (resistance is decreased). At point B, the writing voltage is around −1.2 V, and the current is around −5 µA.

As shown in FIG. 4A, high resistance writing is performed on the variable resistance element 105 in a low resistance state (state at point D), i.e., a positive voltage (writing voltage in HR direction) relative to the lower electrode 106 is applied to the upper electrode 108 such that the absolute value of the voltage gradually increases. The resistance state changes in the direction from point D to point E, and changes from the low resistance state (state near point E) to a high resistance state (state at point F) (resistance is increased). At point E, the writing voltage is around +1.1 V, the current is around +60 µA, the absolute value of the writing voltage is substantially the same as that when resistance is increased (at point B).

During the normal writing operation, to increase the resistance of the variable resistance element 105, a current of around 60 µA needs to flow so that the resistance value reaches point E. The current change when the resistance is increased is a gentle change (shift from point E to point F), and is in the direction in which the current decreases. Meanwhile, to decrease the resistance, a current of around 5 µA may be caused to flow so that the resistance value reaches point B. The current change when resistance is decreased is abrupt, and as is clear from FIG. 4B, the resistance value rapidly drops by more than one order of magnitude from point B to point C.

[5-5. Configuration of Current Steering Element]

As described above, the current steering element 112 in the present embodiment is a current steering element having a current limiting function when resistance is increased, and includes a first electrode 113, a second electrode 115, and a semiconductor layer 114 formed between the first electrode 113 and the second electrode 115.

When the work function of the first electrode 113 is φ1, the electron affinity of the semiconductor layer 114 is χs, and the work function of the second electrode 115 is φ2, the first electrode 113, the second electrode 115, and the semiconductor layer 114 are made of materials satisfying the relationship χs<φ2<φ1.

Specifically, in the present embodiment, the first electrode 113 is made of a material containing a tantalum nitride.

In the present embodiment, the semiconductor layer 114 is formed by depositing a nitrogen-deficient silicon nitride at a thickness of 3 to 20 nm.

In the present embodiment, the second electrode 115 is made of a material which is formed of a metal different from the metal forming the first electrode 113 and contains tungsten.

Here, the work function φ2 of tungsten is 4.6 eV. The electron affinity χs of silicon is 3.78 eV. The work function φ1 of tantalum nitride is 4.76 eV. It is considered that the electron affinity of nitrogen-deficient silicon nitride is close to the electron affinity of silicon. Therefore, the relationship χs<φ2<φ1 is satisfied.

[5-6. Configuration of Current Steering Element]

The following describes the characteristics of the current steering element 112 in the present embodiment.

In the present embodiment, the current steering element 112 is an MSM diode which employs a Schottky barrier formed in the interface between a metal and a semiconductor. It should be noted that in the MSM diode, when the absolute value of the voltage falls below a certain level, a high resistance value is indicated due to the effects of the Schottky barrier which occurs in the interface having a reverse bias. However, when the absolute value of the voltage exceeds the certain level, the resistance value rapidly drops.

Figure 5A:
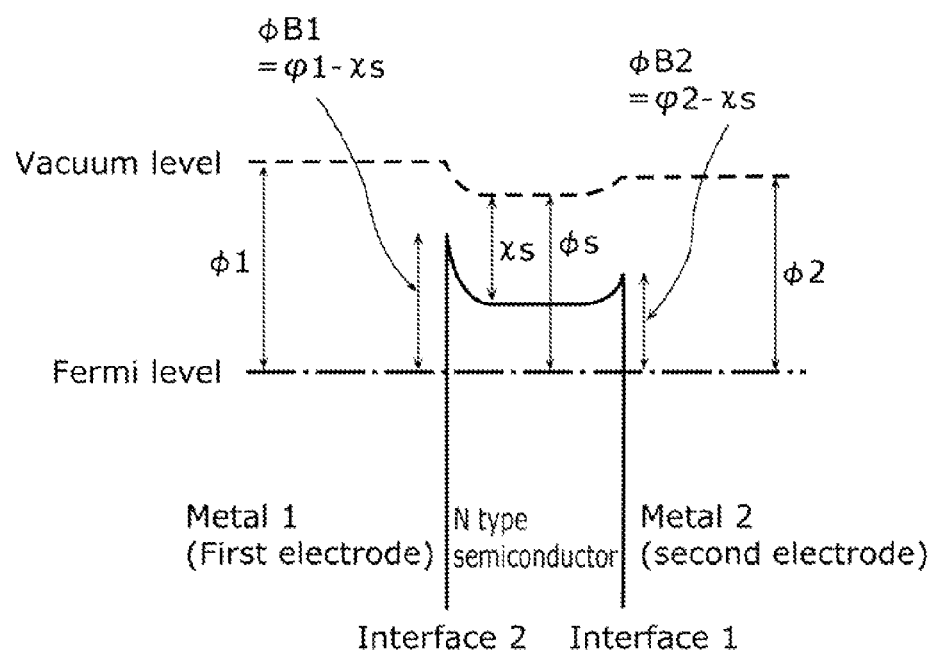
FIG. 5A is an energy band diagram for the vertical direction of a current steering element which is included in a variable resistance nonvolatile memory device according to an embodiment, and has asymmetric current-voltage characteristics.
Figure 5B:
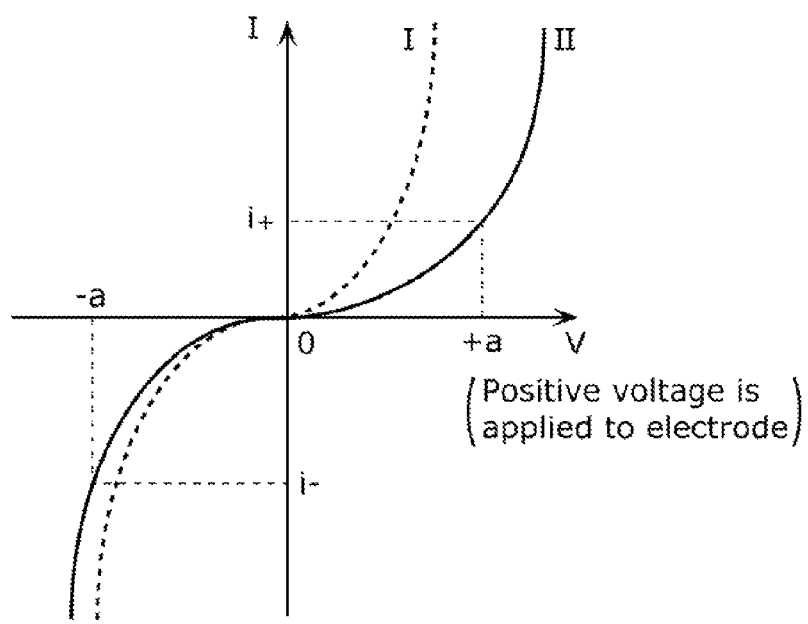
FIG. 5B is a graph schematically showing the current-voltage characteristics of a current steering element which is included in a variable resistance nonvolatile memory device according to an embodiment, and has asymmetric current-voltage characteristics.

The current steering element 112 used in the present embodiment has current-voltage characteristics asymmetric to the polarities of a voltage. Here, FIG. 5A is an energy band diagram for the vertical direction of the current steering element 112 having the asymmetric current-voltage characteristics. FIG. 5B is a graph schematically showing the current-voltage characteristics of the current steering element 112 in FIG. 5A. In FIG. 5B, the broken line (I) indicates the current-voltage characteristics of the current steering element which are symmetric to the polarities, and the solid line (II) indicates the current-voltage characteristics of the current steering element 112 according to the present invention.

As is clear from FIGS. 5A and 5B, in the following case, the current steering element 112 has the current-voltage characteristics that a first current i$_-$ is larger than a second current i$_+$. The first current is the current which flows when a voltage of −a V (a negative polarity relative to the first electrode 113) having a first value is applied to the second electrode 115, the first value being a given value less than a predetermined voltage value and having an absolute value greater than zero. The second current i$_+$ is the current which flows when a voltage of +a (a positive polarity (second polarity different from the first polarity)) having an absolute value which is the first value a is applied. That is, the current steering element 112 in the present embodiment has asymmetric current-voltage characteristics. When the absolute value of a first value a described above is at least greater than the threshold of the current steering element (a voltage at which a current starts flowing), even if any voltage greater than the threshold is applied, a current driving capability is higher when a voltage of negative polarity (first polarity) is applied than when a voltage of positive polarity (second polarity) is applied (|i$_+$|<|i$_-$|). It should be noted that the specific structure and physical characteristics of a current steering element having the asymmetric current-voltage characteristics are detailed in Japanese Patent No. 4,531,863 (patent literature), for example.

[5-7. Explanation for Forming Operation in Nonvolatile Memory Device in Present Invention]

In the memory cell array 10 in the present embodiment, the forming operation in the HR direction is performed, in which a voltage of positive polarity (second polarity) relative to the lower electrode 106 of the variable resistance element 105 is applied to the upper electrode 108.

That is, when the forming of the variable resistance element 105 is performed, a current flows from the upper electrode 108 to the lower electrode 106 in the variable resistance element 105 in the present embodiment. This means that a voltage of the polarity (second polarity) at which the second electrode 115 has a positive potential relative to the potential of the first electrode 113 is applied to the corresponding current steering element 112.

Here, as shown in FIG. 5B, in the current steering element 112, a current $i_+$ when a voltage of +aV is applied is smaller than a current $i_-$ when a voltage of −aV is applied. The polarity at which the potential of the second electrode 115 is a positive potential relative to the potential of the first electrode 113 is a polarity at which the current driving capability of the current steering element 112 declines.

In other words, in the forming operation in the HR direction, the direction of a voltage for forming the variable resistance layer 107 of the variable resistance element 105 is identical to the direction in which the current driving capability of the current steering element 112 is low. Moreover, the direction of a voltage for changing the resistance state of the variable resistance layer 107 of the variable resistance element 105 from a high resistance state to a low resistance state is identical to the direction in which the current driving capability of the current steering element is high.

Thus, in the forming operation in the HR direction performed on the variable resistance elements 105, when a positive voltage relative to the first lines 101 is applied to the second lines 119, a voltage is applied in the direction in which a current is difficult to flow, in the current steering elements 112. Therefore, the current steering elements 112 can suppress abrupt current change during the forming operation. Therefore, it is possible to achieve a variable resistance nonvolatile memory element and a variable resistance nonvolatile memory device which can stably perform the forming operation on the variable resistance elements 105.

[5-8. Configuration of Nonvolatile Memory Device]

Figure 6:
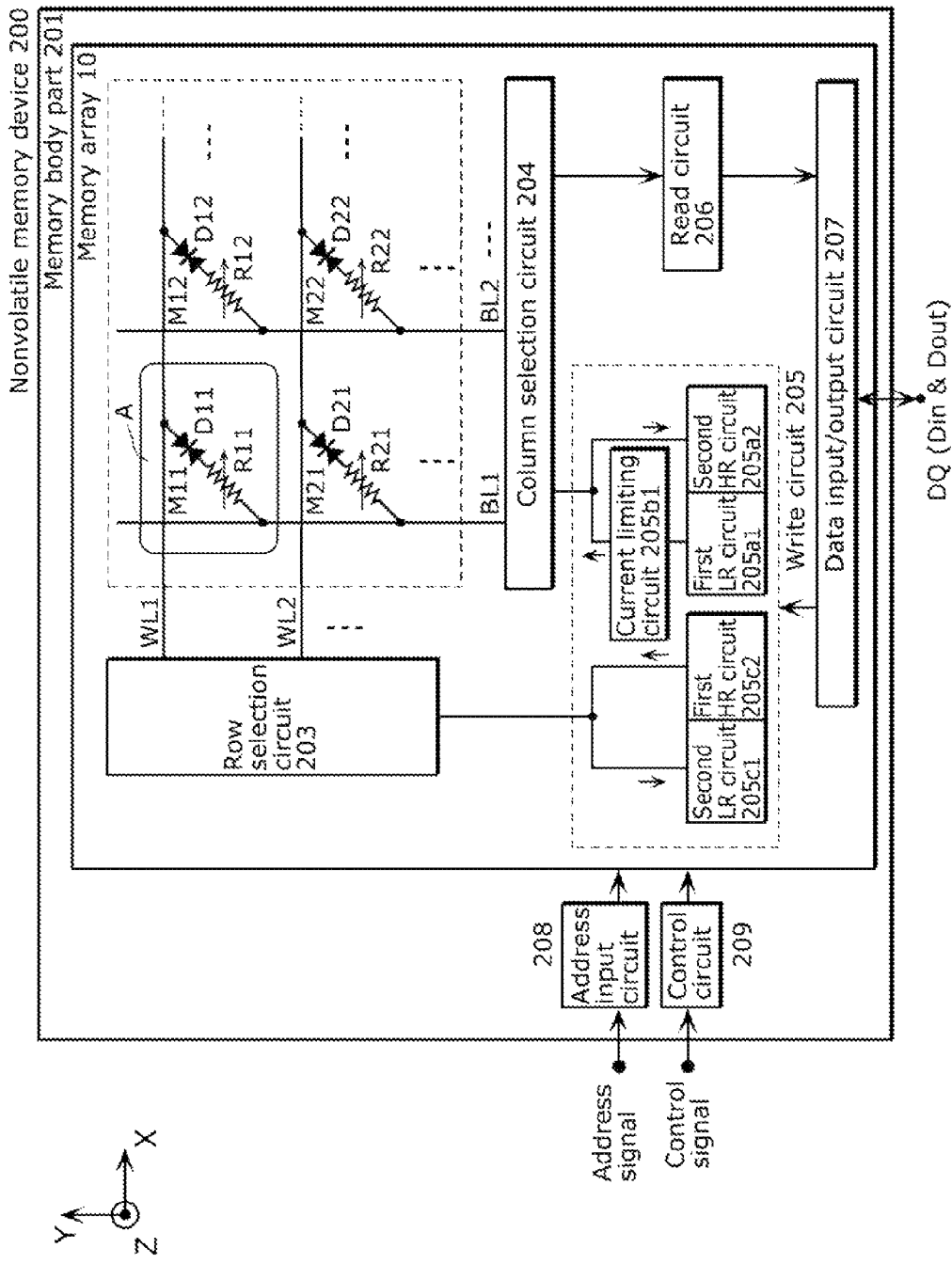
FIG. 6 is a block diagram showing the configuration of a memory cell array and its peripheral circuitry of a variable resistance nonvolatile memory device according to Embodiment 1.

FIG. 6 is a block diagram showing the configuration of the nonvolatile memory device according to the present embodiment.

As shown in FIG. 6, a nonvolatile memory device 200 includes a memory body part 201, an address input circuit 208, and a control circuit 209. The address input circuit 208 receives an address signal which is inputted from outside, and selectively indicates a predetermined address. The control circuit 209 receives a control signal inputted from outside, and controls the operation of the memory body part 201.

The memory body part 201 includes the memory cell array 10, a row selection circuit 203, a column selection circuit 204, a writing circuit 205, and a read circuit 206, and a data input/output circuit 207. The read circuit 206 detects an amount of current flowing through a selection bit line, and determines whether stored data indicates "1" or "0". The data input/output circuit 207 performs input/output processing for input/output data via a terminal DQ.

In the memory cell array 10, m×n memory cells Mij are arrayed in a matrix in the row direction (X direction in FIG. 6) and in the column direction (Y direction in FIG. 6). Here, m and n are natural numbers. FIG. 6 shows only four bits of two rows and two columns. Mij is a natural number with the relationships: $i \leq m$ and $j \leq n$. The same ones are omitted in the following. As described above, in the memory cell Mij, one terminal of a variable resistance element Rij is connected to one terminal of a current steering element Dij. The other terminal of the variable resistance element Rij is connected to a bit line BLj. The other terminal of the current steering element Dij is connected to a word line WLi.

It should be noted that in FIG. 6, bit lines BL1 to BLn each correspond to one of the first lines 101 shown in FIG. 1. Word lines WL1 to WLm each correspond to one of the second lines 119 shown in FIG. 1. The memory cell Mij corresponds to the memory cell 11 shown in FIG. 1. The variable resistance element Rij corresponds to the variable resistance element 105 shown in FIG. 1. The current steering element Dij corresponds to the current steering element 112 shown in FIG. 1.

The row selection circuit 203 selects one of the word lines WL1 to WLm in the read operation or normal writing operation based on an instruction from the control circuit 209.

The column selection circuit 204 selects one of the bit lines BL1 to BLn in the read operation or normal writing operation based on an instruction from the control circuit 209.

During the writing operation, the data input/output circuit 207 receives a data input signal Din, and outputs to the writing circuit 205. Moreover, during the read operation, an output signal from the read circuit 206 is outputted as an output signal bout to the outside of the nonvolatile memory device 200.

The writing circuit 205 includes a first LR circuit 205a1 and a second HR circuit 205a2 for driving the bit lines BL1 to BLn, a current limiting circuit 205b1, and a second LR circuit 205c2 and a first HR circuit 205c1 for driving the word lines WL1 to WLm. The current limiting circuit 205b1 is provided in the path between the first LR circuit 205a1 and the column selection circuit 204, and limits the current which flows through the memory cell Mij when a voltage is applied in the LR direction.

In the present embodiment, the writing circuit 205 performs, when the data input signal Din indicates data "0", low resistance writing on the variable resistance element Rij in the selected memory cell Mij. More specifically, when performing the low resistance writing, the writing circuit 205 causes the first LR circuit 205a1 to drive the bit line BLj at a high level, and causes the second LR circuit 205c2 to drive the word line WLi at a low level.

Moreover, the writing circuit 205 performs, when the data input signal Din indicates data "1", high resistance writing on the variable resistance element Rij in the selected memory cell Mij More specifically, when performing the high resistance writing, the writing circuit 205 causes the first HR circuit 205c1 to drive the word line WLi at a high level, and causes the second HR circuit 205a2 to drive the bit line BLj at a low level.

It should be noted that peripheral circuits such as the column selection circuit 204 and lines such as the bit lines BL1 to BLn are connected to the current limiting circuit 205b1, resulting in a large capacity load. Therefore, followablity by the variable resistance element Rij for current change is lower than that by the current steering element Dij. Therefore, it is preferable that the current limiting circuit 205b1 be disposed as closely as possible to the memory cell array 10.

According to such a configuration, the current limiting circuit 205b1 can suppress a current change with the low resistance writing. It should be noted that a resistance value during low resistance can be controlled by controlling the current limit value of the current limiting circuit 205b1, and this is detailed in WO2010/119671 (patent literature). It should be noted that in FIG. 6, the current limiting circuit 205b1 is disposed proximate to a LR circuit 1 (205a1). However, the current limiting circuit 205b1 may be disposed proximate to an LR circuit 2 (205c2) or disposed in the row selection circuit 203 or the column selection circuit 204.

[5-9. Method of Fabricating Nonvolatile Memory Device]

FIGS. 7A to 7G are cross-sectional views showing steps in the method of fabricating the nonvolatile memory device in the present embodiment.

Figure 7A:
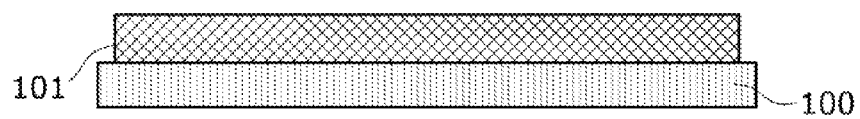
FIG. 7A is a cross-sectional view showing a method of fabricating a variable resistance nonvolatile memory device according to an embodiment.

As shown in FIG. 7A, the first lines 101 are formed, using a desired mask on the substrate 100 where transistors and other lines are formed.

Figure 7B:
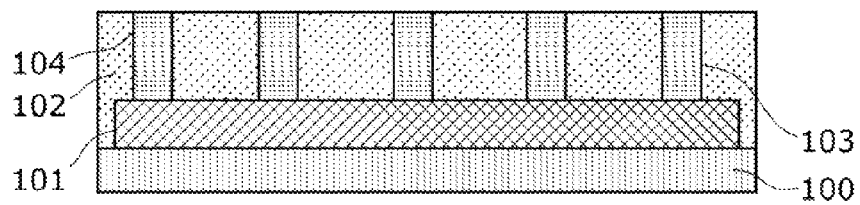
FIG. 7B is a cross-sectional view showing a method of fabricating a variable resistance nonvolatile memory device according to an embodiment.

Moreover, as shown in FIG. 7B, the first interlayer insulating layer 102 is formed above the entire surface of the substrate 100 so as to cover the first lines 101. Moreover, contact holes (openings) which penetrate through the first interlayer insulating layer 102 and reach the first lines 101 are formed. The contact holes are filled with a filling material containing tungsten as the main component. In this way, the first contact plugs 103 and the second contact plugs 104 are formed.

Figure 7C:
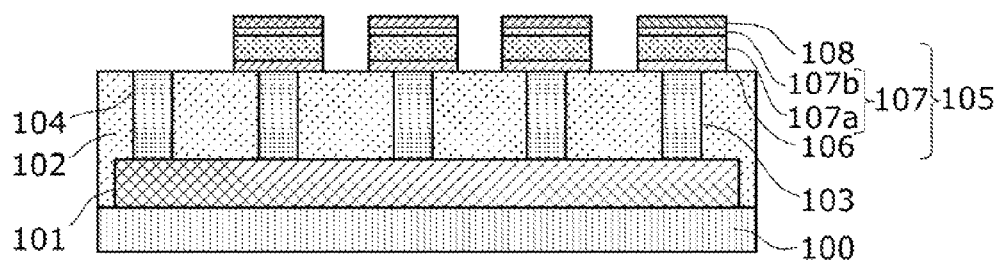
FIG. 7C is a cross-sectional view showing a method of fabricating a variable resistance nonvolatile memory device according to an embodiment.

Moreover, as shown in FIG. 7C, a lower electrode material layer formed of tantalum nitride, a first variable resistance material layer, a second variable resistance material layer, and an upper electrode material layer formed of iridium are formed above the first interlayer insulating layer 102 in this order. The first variable resistance material layer is formed of oxygen-deficient tantalum oxide having a high degree of oxygen deficiency. The second variable resistance material layer is formed of oxygen-deficient tantalum oxide having a lower degree of oxygen deficiency than the first variable resistance material layer. In the present embodiment, the first variable resistance material layer and the second variable resistance material layer can be formed by reactive sputtering in which a tantalum target is sputtered in a gas atmosphere of argon and oxygen. The second variable resistance material layer may be formed by plasma oxidizing the surface of the first variable resistance material layer. Alternatively, the second variable resistance material layer may be formed by other methods such as $Ta_2O_5$ sputter using a $Ta_2O_5$ target, the CVD method, and the ALD method.

Moreover, the lower electrode 106, the variable resistance layer 107 including the first variable resistance layer 107a and the second variable resistance layer 107b, and the upper electrode 108 in the variable resistance element 105 are patterned using a desired mask such that the upper end surfaces of the first contact plugs 103 are covered, and the upper end surfaces of the second contact plug 104 are exposed (this corresponds to the first step).

Figure 7D:
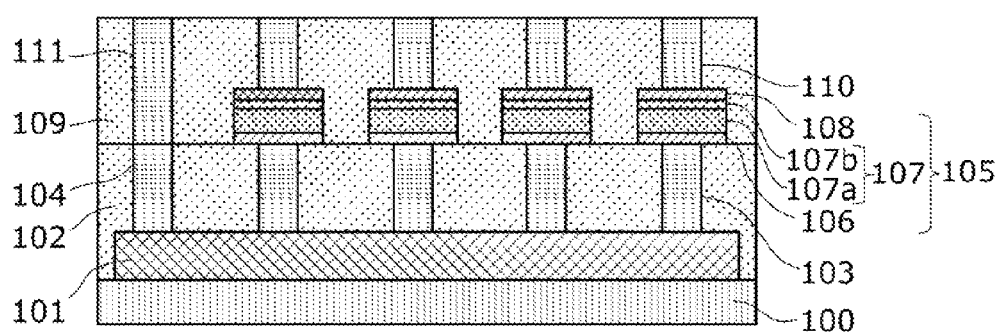
FIG. 7D is a cross-sectional view showing a method of fabricating a variable resistance nonvolatile memory device according to an embodiment.

Moreover, as shown in FIG. 7D, the second interlayer insulating layer 109 is formed above the entire surface of the first interlayer insulating layer 102 so as to cover the variable resistance elements 105. Moreover, contact holes (openings) which penetrate through the second interlayer insulating layer 109 and reach the upper electrodes 108 of the variable resistance elements 105 and contact holes (openings) which penetrate through the second interlayer insulating layer 109 and reach the second contact plugs 104 are formed. The third contact plugs 110 are formed by filling into the former contact holes a filling material containing tungsten as the main component. The fourth contact plugs 111 are formed by filling into the latter contact holes a filling material containing tungsten as the main component.

Figure 7E:
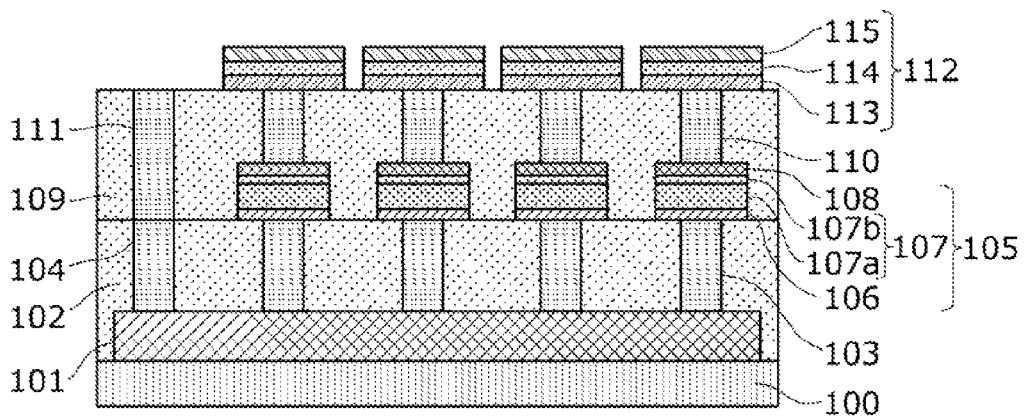
FIG. 7E is a cross-sectional view showing a method of fabricating a variable resistance nonvolatile memory device according to an embodiment.

Moreover, as shown in FIG. 7E, a first electrode material layer formed of tantalum nitride (TaN), a semiconductor material layer formed of silicon or nitrogen-deficient silicon nitride, and a second electrode material layer formed of tungsten are formed in this order above the second interlayer insulating layer 109. Here, when the work function of a first electrode material is $\phi 1$, the work function of a second electrode material is $\phi 2$, and the electron affinity of the semiconductor material layer is $\chi s$, the relationship $\chi s < \phi 2 < \phi 1$ is satisfied. Subsequently, the first electrode 113, the semiconductor layer 114, and the second electrode 115 in the current steering element 112 are patterned using a desired mask such that the upper end surfaces of the third contact plugs 110 are covered, and the upper end surfaces of the fourth contact plugs 111 are exposed (this corresponds to the second step).

Figure 7F:
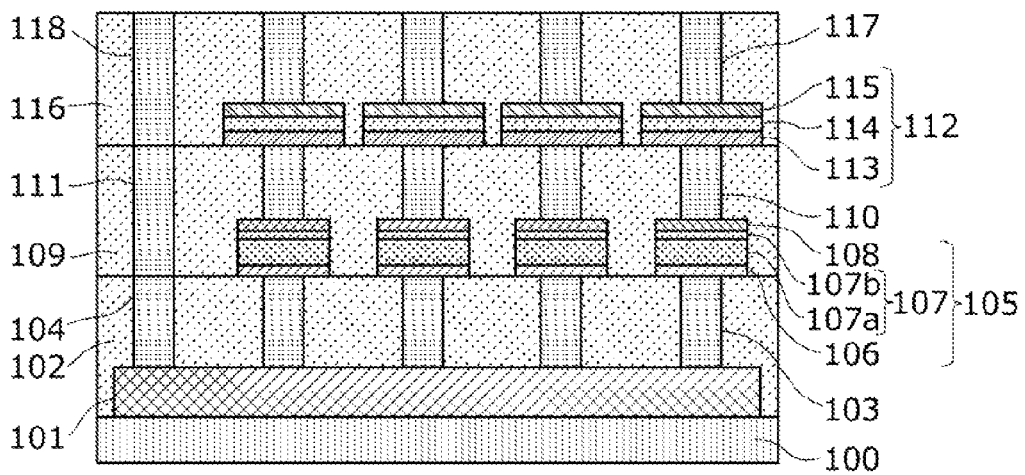
FIG. 7F is a cross-sectional view showing a method of fabricating a variable resistance nonvolatile memory device according to an embodiment.

Moreover, as shown in FIG. 7F, the third interlayer insulating layer 116 is formed above the entire surface of the second interlayer insulating layer so as to cover the current steering elements 112. Moreover, contact holes (openings) which penetrate through the third interlayer insulating layer 116 and reach the second electrodes 115 of the current steering element 112 and contact holes (openings) which penetrate through the third interlayer insulating layer 116 and reach the fourth contact plugs 111 are formed. The fifth contact plugs 117 are formed by filling into the former contact holes a filling material containing tungsten as the main component. The sixth contact plugs 187 are formed by filling into the latter contact holes a filling material containing tungsten as the main component.

Figure 7G:
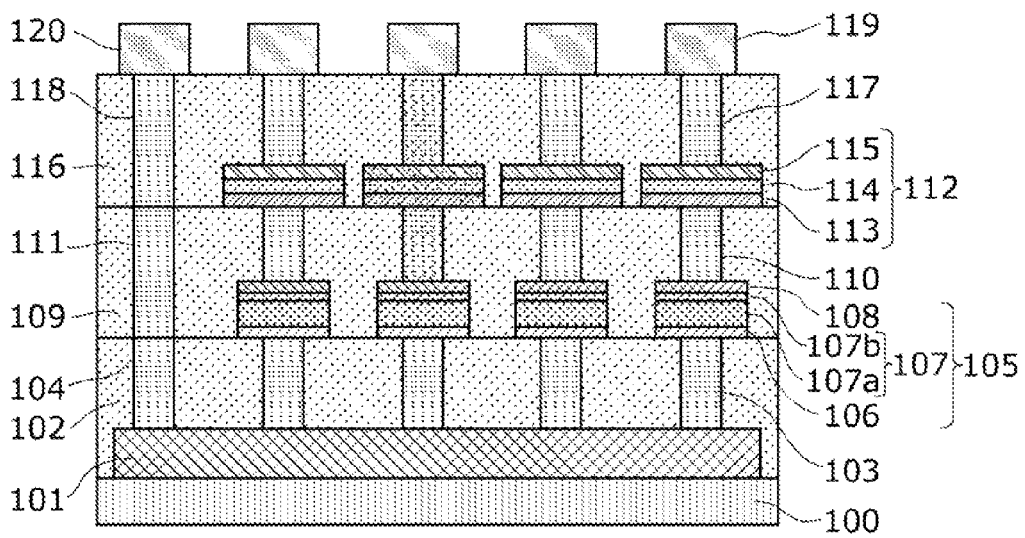
FIG. 7G is a cross-sectional view showing a method of fabricating a variable resistance nonvolatile memory device according to an embodiment.

Furthermore, as shown in FIG. 7G, by depositing a line material on the third interlayer insulating layer 116 and patterning using a desired mask, the second lines 119 are formed to cover the upper end surfaces of the fifth contact plugs 117, and the lead-out line 120 is formed to cover the upper end surfaces of the sixth contact plugs 118.

Moreover, although not shown in the figure, the forming step in which a voltage of the second polarity is applied is performed on the memory cell Mij after the memory cell array 10 and peripheral circuits (the row selection circuit 203, the column selection circuit 204, the writing circuit 205, the read circuit 206, the data input/output circuit 207, the address input circuit 208, and the control circuit 209) shown in FIG. 6 are formed. By so doing, the resistance value of the variable resistance element Rij (the variable resistance elements 105 in FIG. 1) of the memory cell Mij changes from a first resistance state which is higher in resistance value than a high resistance state to the high resistance state. This enables the normal writing operation.

It is possible to achieve a nonvolatile memory device (variable resistance nonvolatile memory device) which can satisfyingly limit a current during the forming operation in the HR direction by employing the above fabrication method. Since a current steering element is provided in a memory cell in the present embodiment, an abrupt change in a current can be well followed.

It should be noted that in the above fabrication method, the current steering element 112 is formed above the variable resistance element 105 after forming the variable resistance element 105 in the direction perpendicular to the substrate surface. However, the variable resistance element 105 may be formed above the current steering element 112 after forming the current steering element 112.

Moreover, in the variable resistance element 105, the standard electrode potential of the upper electrode 108 is higher than the standard electrode potential of a metal forming a variable resistance layer and the standard electrode potential of the lower electrode 106 such that (i) resistance is increased when a writing current flows from the upper electrode 108 to the lower electrode 106, and (ii) resistance is decreased when a wiring current flows from the lower electrode 106 to the upper electrode 108. However, the upside-down configuration in the direction perpendicular to the substrate surface may be used. In this case, the current steering element 112 also has an upside-down configuration in the direction perpendicular to the substrate surface.

6. Embodiment 2

Figure 8:
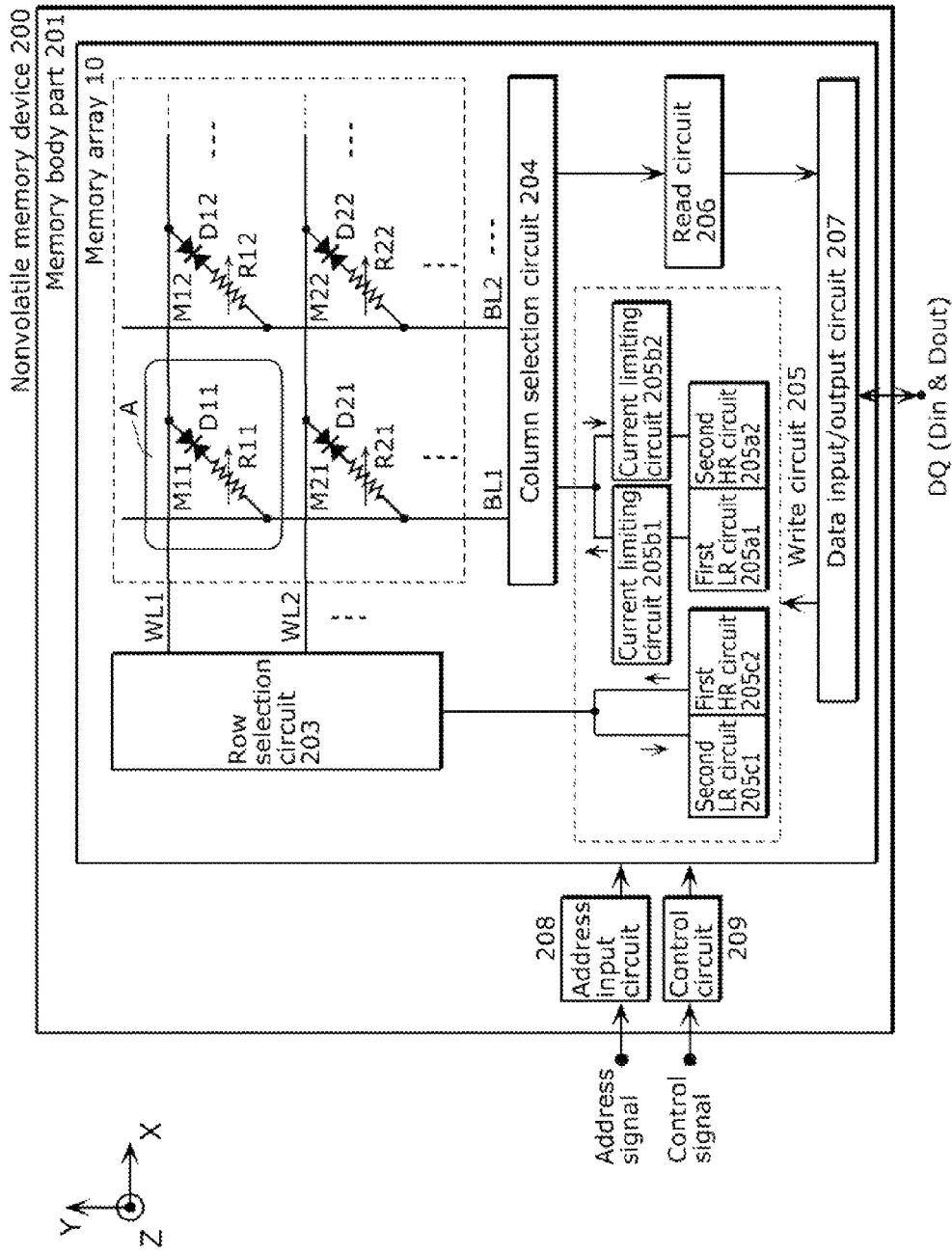
FIG. 8 is a schematic block diagram showing the configuration of a memory cell array and its peripheral circuitry of a variable resistance nonvolatile memory device according to Embodiment 2.

With reference to FIG. 8, the following describes a nonvolatile memory device (variable resistance nonvolatile memory device) according to Embodiment 2.

The nonvolatile memory device in the present embodiment different from the nonvolatile memory device in Embodiment 1 in the following point. A current limiting circuit 205b2 is provided to limit the current which flows through a memory cell when a voltage in the HR direction (voltage of second polarity, voltage applied in high resistance writing) is further applied to a writing circuit 205.

FIG. 8 is a block diagram showing a configuration of the nonvolatile memory device according to the present embodiment.

As shown in FIG. 8, a nonvolatile memory device 200 according to the present embodiment includes a memory body part 201, an address input circuit 208, and a control circuit 209. The address input circuit 208 receives an address signal inputted from outside, and selectively indicates a predetermined address. The control circuit 209 receives a control signal inputted from outside, and controls the operation of the memory body part 201. It should be noted that the configurations of the address input circuit 208 and the control circuit 209 are the same as those in Embodiment 1.

The memory body part 201 includes a memory cell array 10, a row selection circuit 203, a column selection circuit 204, the writing circuit 205, a read circuit 206, and a data input/output circuit 207. It should be noted that the configurations except the configuration of the writing circuit 205, i.e., the configurations of the memory cell array 10, the row selection circuit 203, the column selection circuit 204, the read circuit 206, and the data input/output circuit 207 are the same as those in Embodiment 1.

The writing circuit 205 according to the present embodiment includes a current limiting circuit 205b2 which is provided in the path between a second HR circuit 205a2 and the column selection circuit 204, and limits the current which flows through a memory cell Mij when a voltage is applied in the HR direction, in addition to (i) a first LR circuit 205a1 and the second HR circuit 205a2, (ii) a current limiting circuit 205b1, and (iii) a second LR circuit 205c2 and a first HR circuit 205c1. Here, (i) the first LR circuit 205a1 and the second HR circuit 205a2 drive bit lines BL1 to BLn. (ii) The current limiting circuit 205b1 is provided in the path between the first LR circuit 205a1 and the column selection circuit 204, and limits the current which flows through a memory cell when a voltage is applied in the LR direction. (iii) The second LR circuit 205c2 and the first HR circuit 205c1 drive the word lines WL1 to WLm. It should be noted that the configurations of the first LR circuit 205a1, the second HR circuit 205a2, the current limiting circuit 205b1, the second LR circuit 205c2, and the first HR circuit 205c1 are the same as those in Embodiment 1.

According to this configuration, when low resistance writing is performed in the normal operation, a current which flows through the variable resistance element Rij can be limited by the current limiting circuit 205b1. When a forming operation in the HR direction or high resistance writing is performed in the normal operation, a current which flows through the variable resistance element Rij can be limited by the current limiting circuit 205b2.

In the present embodiment, the current limit values of the current limiting circuit 205b1 and the current limiting circuit 205b2 are set to be the same current limit value. Specifically, the current limit value is less than the value of a breakdown current for the current steering element Dij, and is set to a current value at which the resistance state of the variable resistance element Rij changes to a high resistance state.

In the present embodiment, in the forming operation in the HR direction, it is possible to prevent a current flowing through a memory cell Mij from exceeding the destruction threshold current of a current steering element Dij (current steering element 112 in FIG. 1) by setting the current limit value of the current limiting circuit 205b2 to be less than the value of a destruction threshold current for the current steering element Dij. This can prevent (i) the destruction of the current steering element Dij during the forming operation in the HR direction and (ii) decline in reliability.

Furthermore, in the present embodiment, when the current limit value of the current limiting circuit 205b2 is set to the value of a current (less than a destruction threshold current) at which the resistance state of the variable resistance element 105 is increased, the resistance value of the variable resistance element is around the value of the high resistance state during the forming operation. Therefore, it is possible to prevent the resistance value from excessively dropping. This is because during the forming operation, the resistance value of the variable resistance element Rij (variable resistance elements 105 in FIG. 1) is prevented from changing to a value less than the value of a low resistance state in the normal wiring operation, and the disenablement of high resistance writing due to the change of the resistance value to a value less than the value of the low resistance state is prevented. In this case, the current limiting circuit 205b2 may operate also when resistance is increased in the normal operation, or only operate in the forming operation.

Moreover, when the same value is set to (i) the current limit value (which is less than the value of current at which the resistance of the variable resistance element 105 is increased) of the current limit circuit 205b1 and (ii) the current limit value of the current limiting circuit 205b2, the resistance value of the variable resistance element is higher than the resistance value of a high resistance state during the forming operation. Therefore, it is possible to prevent the resistance value from excessively dropping. Here, the current limit circuit 205b1 limits a current when a voltage is applied in the LR direction. The current limiting circuit 205b2 limits a current when a voltage is applied in the HR direction. It should be noted that for a bidirectional variable resistance element used in the present invention, substantially the same current is necessary when resistance is increased and when resistance is decreased in the normal operation as shown in FIG. 4A. A current necessary when the forming operation is performed toward a high resistance state is larger than a current necessary when the forming operation is performed toward a low resistance state. Therefore, the current limiting circuit 205b2 only operates in the forming operation.

7. Modification of Embodiment(s)

Moreover, an oxygen-deficient tantalum oxide is used for a variable resistance material forming the variable resistance layer 107 in Embodiments 1 and 2. However, other materials may be used. Other oxygen-deficient metal oxide may be used for the variable resistance material. The other oxygen-deficient metal oxide may be, for example, a hafnia or a zirconium oxide. When the hafnia is used and the composition of the hafnia is $HfO_x$, at least the relationship $0<x<2.0$ may be satisfied. Furthermore, the relationship may be around $0.9 \leq x \leq 1.6$. When the zirconium oxide is used, and the composition of the zirconium oxide is $ZrO_x$, at least the relationship $0<x<2.0$ may be satisfied. Moreover, the relationship may be around $0.9 \leq x \leq 1.4$. This composition range enables a stable operation for changing resistance.

Moreover, in the variable resistance element 105, the variable resistance layer 107 may have a stacked structure. That is, the variable resistance layer 107 has a structure in which a first variable resistance layer made of a first metal oxide and a second variable resistance layer made of a second metal oxide are stacked. Here, the second variable resistance layer is less oxygen deficient and thinner in film thickness than the first variable resistance layer.

For example, when a tantalum oxide is used, the variable resistance layer 107 is formed of the stacked structure including a first tantalum oxide layer (composition: $TaO_x$) and a second tantalum oxide layer (composition: $TaO_y$). Here, $0<x<2.5$ and $x<y$ may be satisfied. Furthermore, the second tantalum oxide layer ($TaO_y$) may be in contact with an upper electrode, have a film thickness ranging from 1 nm to 8 nm, and satisfy $0.8 \leq x \leq 1.9$ and $2.1 \leq y$. It should be noted that the first tantalum oxide layer can be formed by, for example, the reactive sputtering in which a tantalum target is sputtered in an oxygen gas atmosphere. Moreover, the second tantalum oxide layer can be formed by, for example, the reactive sputtering in which a tantalum target is sputtered in the oxygen gas atmosphere.

When the hafnia is used for the variable resistance layer of stacked structure, the variable resistance layer is formed of the stacked structure including a first hafnia layer (composition: $HfO_x$) and a second hafnia layer (composition: $HfO_y$). Here, $0<x<2.0$ and $x<y$ may be satisfied. Moreover, the second hafnia layer ($HfO_y$) may be in contact with an upper electrode, have a film thickness ranging from 3 nm to 4 nm, and satisfy $0.9 \leq x \leq 1.6$ and $1.8<y$. It should be noted that the first hafnia layer can be formed by, for example, the reactive sputtering in which an Hf target is sputtered in the argon gas and the oxygen gas. Moreover, the second hafnia layer can be formed by, for example, exposing the surface of the first hafnia layer by plasma from argon gas and oxygen gas.

When a zirconium oxide is used for the variable resistance layer of stacked-structure, the variable resistance layer is formed of the stacked structure including a first zirconium oxide layer (composition: $ZrO_x$) and a second zirconium oxide layer (composition: $ZrO_y$). Here, $0<x<2.0$ and $x<y$ may be satisfied. Moreover, the second zirconium oxide layer (composition: $ZrO_y$) may be in contact with an upper electrode, have a film thickness ranging from 1 nm to 5 nm, and satisfy $0.9 \leq x \leq 1.4$ and $1.9<y$. It should be noted that the first zirconium oxide layer can be formed by, for example, the reactive sputtering in which a Zr target is sputtered in the argon gas and the oxygen gas. Moreover, the second zirconium oxide layer can be formed by, for example, exposing the surface of the first zirconium oxide layer by plasma from argon gas and oxygen gas.

Moreover, when the variable resistance layer 107 has a stacked structure, different metals may be used for (i) a first metal forming a first metal oxide to be the first variable resistance layer and (ii) a second metal forming a second metal oxide to be the second variable resistance layer. In this case, the second metal oxide is less oxygen deficient and higher in resistance than the first metal oxide.

Moreover, as long as the variable resistance layer 107 includes an oxide layer such as a tantalum oxide, a hafnium, or zirconium oxide as a main variable resistance layer in which resistance change appear, other trace elements may be contained in the variable resistance layer 107. A small amount of other element can be intentionally contained by making fine adjustments of the resistance value, for example. Such a case is also included in the scope of the present invention. For example, addition of nitrogen to the variable resistance layer increases the resistance value of the variable resistance layer. This can improve the reactivity in the resistance change.

Moreover, when a resistive film is formed by sputtering, trace elements sometimes happen to be mixed into the resistive film by residual gas or gas release from a vacuum container wall. However, such a case where trace elements are mixed into the resistive film is, of course, included in the scope of the present invention.

The semiconductor memory device and method of fabricating the same were described above based on the embodiments. However, the present invention is not limited to these embodiments. The present invention also includes, without departing from the scope of the present invention, a variable resistance nonvolatile element and a method of fabricating the same achieved by making various modifications which those skilled in the art would conceive or arbitrarily combining structural elements in the present embodiment.

INDUSTRIAL APPLICABILITY

The variable resistance nonvolatile memory device according to the present invention has high reliability and stable writing characteristics, and is useful as a nonvolatile memory device for use in various electronic appliances such as digital household appliances, memory cards, cellular phones, and personal computers.

REFERENCE SIGNS LIST 10 memory cell array
11 memory cell
100 substrate
101 first line
102 first interlayer insulating layer
103 first contact plug
104 second contact plug
105 variable resistance element
106 lower electrode
107 variable resistance layer
108 upper electrode
109 second interlayer insulating layer
110 third contact plug
111 fourth contact plug
112 current steering element
113 first electrode
114 semiconductor layer
115 second electrode
116 third interlayer insulating layer
117 fifth contact plug
118 sixth contact plug
119 second line
120 lead-out line
200 nonvolatile memory device
201 memory body part
203 row selection circuit
204 column selection circuit
205 writing circuit
205a1 first LR circuit
205a2 second HR circuit
205b1 current limiting circuit
205b2 current limiting circuit
205c1 first HR circuit 205c2 second LR circuit
206 read circuit
207 data input/output circuit
208 address input circuit
209 control circuit
Rij variable resistance element
Dij current steering element
Mij memory cell

The invention claimed is:

1. A variable resistance nonvolatile memory device comprising:
   a plurality of first signal lines and a plurality of second signal lines which cross;
   a memory cell array including a plurality of memory cells disposed at cross points at which the first signal lines and the second signal lines cross, the memory cells each having an end connected to one of the first signal lines and another end connected to one of the second signal lines; and
   a write circuit which generates a bipolar voltage to be applied to the memory cells via the first signal lines and the second signal lines;
   wherein the memory cells each further include:
   a variable resistance element of which a resistance state changes to a low resistance state when a first voltage of a first polarity is applied, and changes to a high resistance state when a second voltage of a second polarity opposite to the first polarity is applied, the high resistance state being higher than the low resistance state in resistance value; and
   a current steering element in which a first current is larger than a second current, the first current being a current which flows when a voltage of the first polarity having a first value is applied, the first value being a given value less than a predetermined voltage value and having an absolute value greater than zero, the second current being a current which flows when a voltage of the second polarity having an absolute value which is the first value is applied, and
   in each of the memory cells, the variable resistance element and the current steering element are connected in series.

2. The variable resistance nonvolatile memory device according to claim 1, further comprising
   a first current limiting circuit for limiting a current flowing in a direction in which resistance states of the memory cells are changed to the low resistance state, the first current limiting circuit being provided in a path of a current which flows from the write circuit to the memory cells.

3. The variable resistance nonvolatile memory device according to claim 1, further comprising:
   a first current limiting circuit for limiting a current flowing in a direction in which resistance states of the memory cells are changed to the low resistance state, the first current limiting circuit being provided in a path of a current which flows from the write circuit to the memory cells; and
   a second current limiting circuit for limiting a current flowing in a direction in which resistance states of the memory cells are changed to the high resistance state, the second current limiting circuit being provided in a path of the current which flows from the write circuit to the memory cells.

4. The variable resistance nonvolatile memory device according to claim 3,
   wherein a current limit value of the second current limiting circuit is less than a value of a breakdown current for the current steering element.

5. The variable resistance nonvolatile memory device according to claim 3,
   wherein a current limit value of the second current limiting circuit is a current value at which the resistance state of the variable resistance element changes to the high resistance state.

6. The variable resistance nonvolatile memory device according to claim 3,
   wherein a current limit value of the first current limiting circuit is equal to a current limit value of the second current limiting circuit.

7. The variable resistance nonvolatile memory device according to claim 1,
   wherein the write circuit performs a forming operation on the memory cells after the memory cells are formed and before a normal writing operation is executed, the forming operation being an operation in which a voltage of the second polarity having an absolute value greater than a value of the second voltage is applied.

* * * * *